(12) United States Patent
Shinohara et al.

(10) Patent No.: US 7,348,245 B2
(45) Date of Patent: Mar. 25, 2008

(54) SEMICONDUCTOR DEVICE AND A METHOD OF MANUFACTURING THE SAME

(75) Inventors: Masaaki Shinohara, Itami (JP); Kozo Watanabe, Yokosuka (JP); Fukuo Owada, Hitachinaka (JP); Takashi Aoyama, Hitachinaka (JP)

(73) Assignee: Renesas Technology Corp., Tokyo (JP)

( * ) Notice: Subject to any disclaimer, the term of this patent is extended or adjusted under 35 U.S.C. 154(b) by 2 days.

(21) Appl. No.: 11/443,257

(22) Filed: May 31, 2006

(65) Prior Publication Data

US 2006/0228860 A1 Oct. 12, 2006

Related U.S. Application Data

(63) Continuation of application No. 10/833,118, filed on Apr. 28, 2004, now Pat. No. 7,118,972.

(30) Foreign Application Priority Data

Apr. 28, 2003 (JP) ............................. 2003-124244
Jan. 28, 2004 (JP) ............................. 2004-020210

(51) Int. Cl.
*H01L 21/8234* (2006.01)
(52) U.S. Cl. ...................... 438/275; 438/279
(58) Field of Classification Search ................ 438/275
See application file for complete search history.

(56) References Cited

U.S. PATENT DOCUMENTS 5,329,482 A 7/1994 Nakajima et al.
2004/0152262 A1 8/2004 Ichige et al.

FOREIGN PATENT DOCUMENTS

JP 5-102428 4/1993
JP 6-181293 6/1994
JP 7-176729 7/1995

*Primary Examiner*—Long Pham
(74) *Attorney, Agent, or Firm*—Antonelli, Terry, Stout & Kraus, LLP.

(57) ABSTRACT

Manufacturing method of a semiconductor device for forming a rewritable nonvolatile memory cell including a first field effect transistor for memory, a circuit including a second field effect transistor and a circuit including a third field effect transistor, including forming a gate insulating film over a semiconductor substrate, a gate electrode over the gate insulating film and sidewall spacers over the sidewalls of the gate electrode associated with each of the first through third field effect transistors. The sidewall spacers of at least the first field effect transistor have a different width than that of at least the second field effect transistor, the gate electrode of the third field effect transistor has a different length than that of at least the first field effect transistor for memory and the gate insulating film of the third field effect transistor has a thickness larger than that of the second field effect transistor.

13 Claims, 21 Drawing Sheets

|       | Vs(V) | Vmg(V) | Vcg(V) | Vd(V) | Vsub(V) |
|-------|-------|--------|--------|-------|---------|
| Write | -10.5 | 1.5    | 1.5    | -10.5 | -10.5   |
| Erase | 1.5   | -8.5   | 1.5    | 1.5   | 1.5     |
| Read  | 0     | 0      | 2.0    | 0.8   | 0       |

34: MEMORY GATE ELECTRODE
42: CONTROL GATE ELECTRODE
43~45: GATE ELECTRODE
A~E: SIDE WALL

SEMICONDUCTOR DEVICE AND A METHOD OF MANUFACTURING THE SAME

CONTINUING/PRIORITY DATA INFORMATION

The present application is a continuation application of U.S. application Ser. No. 10/833,118, filed Apr. 28, 2004 now U.S. Pat. No. 7,118,972, the entire disclosure of which is hereby incorporated by reference into this application.

The present application claims priority from Japanese patent applications JP 2004-020210 filed on Jan. 28, 2004 and JP 2003-124244, filed on Apr. 28, 2003, the contents of which are hereby incorporated by reference into this application.

CROSS-REFERENCE TO RELATED APPLICATION

Applicants also wish to make known a U.S. patent application Ser. No. 11/443,252 filed on even date with the present application which is a divisional of U.S. application Ser. No. 10/833,118, filed Apr. 28, 2004.

BACKGROUND OF THE INVENTION

The present invention relates to a method of manufacture of a semiconductor device, more particularly, to the manufacture of a semiconductor device having a nonvolatile memory.

A conventional semiconductor chip (which will hereinafter simply be called a "chip") has, in the circuits thereover, semiconductor elements, such as a MOS (Metal Oxide Semiconductor) transistor requiring a current driving capability and another MOS transistor requiring a higher breakdown voltage, and which operates at a higher voltage than the former MOS transistor.

As a first related method employed for the manufacture of these MOS transistors, the following method can be given as an example. After the formation of a gate electrode of an MOS transistor requiring a current driving capability and a gate electrode of another MOS transistor requiring a high breakdown voltage, an insulating film is formed to cover these gate electrodes. The gate electrode of the MOS transistor requiring a high breakdown voltage is covered with a resist film, followed by wet etching, whereby the thickness of the insulating film that has been formed to cover the gate electrode of the MOS transistor requiring a current driving capability is reduced. Anisotropic dry etching is then performed to form relatively narrow sidewall spacers over the sidewalls of the gate electrode of the MOS transistor requiring a current driving capability. While the resist film covering the gate electrode of the MOS transistor requiring a high breakdown voltage is removed, the gate electrode of the MOS transistor requiring a current driving capability is covered with a resist film. Anisotropic dry etching is conducted to form relatively wide sidewall spacers over the gate electrode of the MOS transistor requiring a high breakdown voltage (refer to, for example, Patent Document 1 and Patent Document 2).

The following is a description of an example of a second related method. After formation of a gate electrode of an MOS transistor requiring a high breakdown voltage and a gate electrode of another MOS transistor requiring a current driving capability, a silicon oxide film, a silicon nitride film and a silicon oxide film are formed successively to cover these gate electrodes. The gate electrode of the MOS transistor requiring a high breakdown voltage is covered with a resist film. Wet etching is then performed to remove the silicon oxide film of the third layer, which has been formed to cover the gate electrode of the MOS transistor requiring a current driving capability. The silicon oxide film which is formed as the first layer and silicon nitride film which is formed as the second layer to cover the gate electrode of the MOS transistor requiring a current driving capability are removed by anisotropic etching to form relatively narrow sidewall spacers. The resist film covering the gate electrode of the MOS transistor requiring a current driving capability is then removed. The three film layers, that is, the silicon oxide film, silicon nitride film and silicon oxide film formed that have been to cover the gate electrode of the MOS transistor requiring a high breakdown voltage are removed by anisotropic etching to form relatively wide sidewall spacers (refer to, for example, Patent Document 3).

[Patent Document 1] Japanese Unexamined Patent Publication No. Hei 7(1995)-176729 (pages 4 to 5, FIGS. 4 to 5)

[Patent Document 2] Japanese Unexamined Patent Publication No. Hei 6(1994)-181293 (pages 9 to 10, FIG. 2)

[Patent Document 3] Japanese Unexamined Patent Publication No. Hei 5(1993)-102428 (pages 2 to 3, FIGS. 10 to 13)

SUMMARY OF THE INVENTION

There is a demand for the manufacture of a semiconductor device having an MOS transistor requiring a current driving capability and another MOS transistor requiring a high breakdown voltage, and including a rewritable nonvolatile memory cell, using process steps which are as simple as possible, while improving the electrical properties of each element, for example, the writing properties for writing data into the rewritable nonvolatile memory cell.

In the above-described first related method, the film thickness of the insulating film formed over the gate electrode of the MOS transistor requiring a current driving capability is reduced by wet etching. However, it is difficult to control the film thickness by wet etching, and so the manufacturing steps become complex when wet etching is adopted.

In the above-described second related method, the sidewall-spacer forming step includes a step of forming a resist film over the gate electrode of the MOS transistor requiring a high breakdown voltage and a subsequent step of forming a resist film over the MOS transistor requiring a current driving capability. This technique needs two more masks compared with the technique of forming two sidewall spacers through use of one mask, and, therefore, this procedure complicates the manufacturing steps.

An object of the present invention is to provide a method which is capable of manufacturing a semiconductor device which has an MOS transistor working at a low voltage and requiring a relatively high current driving capability for high speed operation, and another MOS transistor requiring a high breakdown voltage, and which includes a rewritable nonvolatile memory cell, using simplified steps, while improving the electrical properties of each element.

The above-described and the other objects and novel features of the present invention will be more apparent from the following description herein and the accompanying drawings.

Of the aspects of the invention disclosed in the present application, representative ones will be outlined briefly.

In one aspect of the present invention, there is provided a semiconductor device having a rewritable nonvolatile memory cell including a first field effect transistor for memory and a circuit including a second field effect transistor formed in different regions over a semiconductor substrate, which comprises (a) a first gate electrode of the first field effect transistor, (b) first sidewall spacers formed over the sidewalls of the first gate electrode, (c) a second gate electrode of the second field effect transistor, and (d) second sidewall spacers formed over the sidewalls of the second gate electrode, wherein the width of the first sidewall spacers is different from that of the second sidewall spacers.

In another aspect of the present invention, there is also provided a semiconductor device having an electrically rewritable nonvolatile memory cell formed over a semiconductor substrate, the nonvolatile memory cell comprising (a) a first gate insulating film formed over the semiconductor substrate, (b) a charge storage film formed over the first gate insulating film, (c) a first electrode formed over the charge storage film directly or via an intermediate insulating film, and (d) first sidewall spacers formed over the sidewalls of the first gate electrode, wherein the first sidewall spacers are formed of a film stack containing therein a silicon nitride film; and a non-charge storage film exists between the silicon nitride film and the semiconductor substrate, and between the first gate electrode and the charge storage film.

In a further aspect of the present invention, there is also provided a manufacturing process for the fabrication of a semiconductor device to effect the formation of a rewritable nonvolatile memory cell including a first field effect transistor for memory and a circuit including a second field effect transistor in different regions over the semiconductor substrate, which comprises the steps of: (a) forming a first gate electrode of the first field effect transistor, (b) forming a second gate electrode of the second field effect transistor, and (c) forming first sidewall spacers over the sidewalls of the first gate electrode, while forming second sidewall spacers over the sidewalls of the second gate electrode, the step (c) further comprising the sub-steps of: (c1) forming a first insulating film to cover the first gate electrode and the second gate electrode, (c2) forming a second insulating film over the first insulating film, (c3) forming a third insulating film over the second insulating film, (c4) removing the third insulating film formed to cover the second gate electrode without removing the third insulating film formed to cover the first gate electrode, (c5) removing the third insulating film while leaving the third insulating film over the sidewalls of the first gate electrode, (c6) removing the second insulating film without removing the second insulating film formed over the sidewalls of the second gate electrode, and (c7) removing the second insulating film formed over the sidewalls of the second gate electrode, and removing the first insulating film while leaving the first insulating film formed over the sidewalls of the first gate electrode and the sidewalls of the second gate electrode, to form the first sidewall spacers constituted of the first insulating film, the second insulating film and the third insulating film and the second sidewall spacers constituted of the first insulating film.

In a still further aspect of the present invention, there is also provided a manufacturing method for the fabrication of a semiconductor device comprising the steps of: (a) forming a first gate insulating film in a first region over a semiconductor substrate; (b) forming a charge storage film over the first gate insulating film; (c) forming a first gate electrode over the charge storage film directly or via an intermediate insulating film; (d) forming a second gate insulating film in a second region over the semiconductor substrate; (e) forming a second gate electrode over the second gate insulating film; (f) depositing a first insulating film over the semiconductor substrate including the first region and the second region to cover the first gate electrode and the second gate electrode; (g) depositing a second insulating film over the first insulating film; (h) depositing a third insulating film over the second insulating film; (i) processing the third insulating film; (j) removing the processed third insulating film from the second region; (k) processing the second insulating film; and (l) processing the first insulating film to form, over the sidewalls of the first gate electrode, first sidewall spacers made of the first insulating film, the second insulating film and the third insulating film and, over the sidewalls of the second gate electrode, second sidewall spacers made of the first insulating film and the second insulating film.

Advantages available by the representative aspects, among the features disclosed by the present application, will next be described briefly.

In a semiconductor device including a rewritable nonvolatile memory cell, the electrical properties of each element can be improved. A semiconductor device including a rewritable nonvolatile memory cell can be manufactured by simplified steps.

DETAILED DESCRIPTION OF THE PREFERRED EMBODIMENTS

Figure 1:
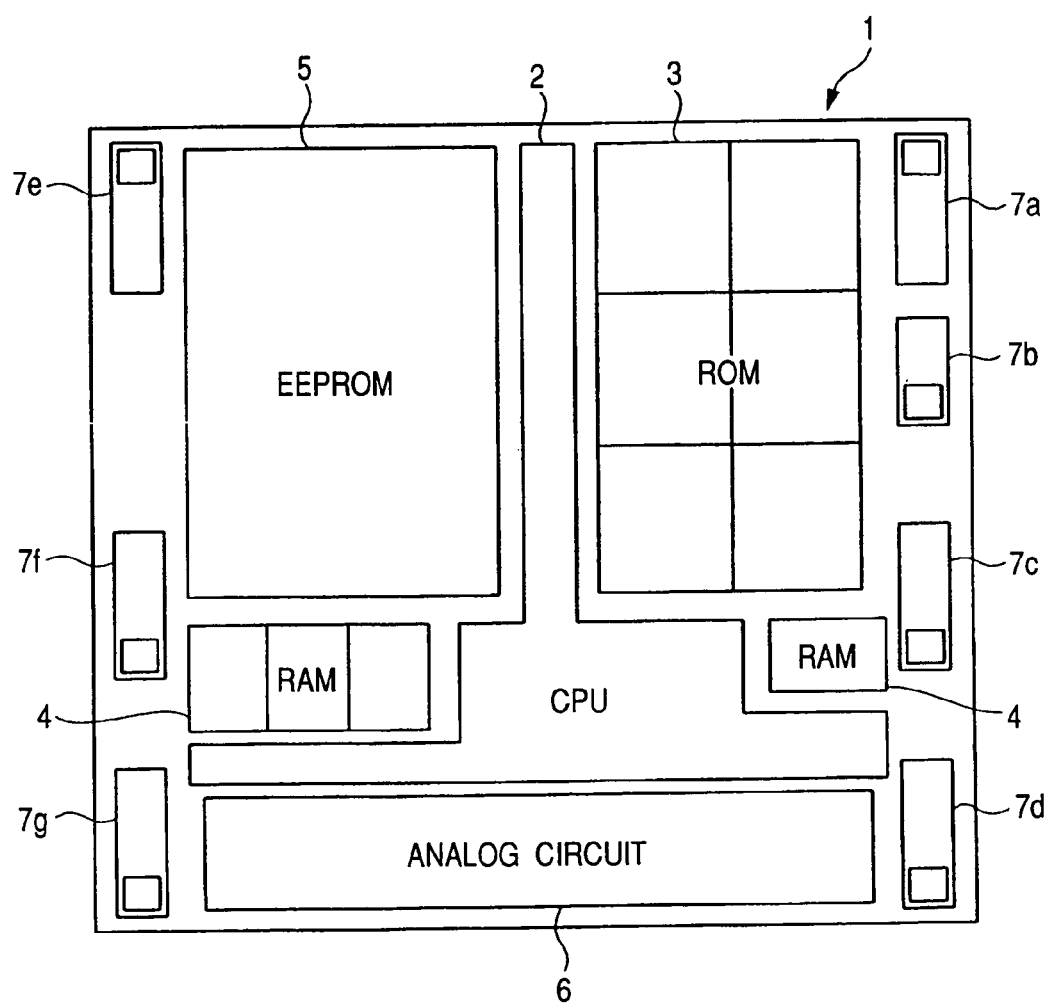
FIG. 1 is a top plan view illustrating the layout of a semiconductor chip according to Embodiment 1 of the present invention.

Embodiments of the present invention will be described specifically based on the accompanying drawings. In all the drawings, elements having a like function will be identified by like reference numerals, and overlapping descriptions thereof will be omitted.

Embodiment 1

Embodiment 1 of the present invention is directed, for example, to the manufacture of a semiconductor device equipped with a low voltage MIS transistor, which is an MIS (Metal Insulator Semiconductor) transistor (field effect transistor) requiring a high current driving capability and which operates at a relatively low voltage for high speed operation, and a high voltage MIS transistor, which operates at a relatively high voltage to enable an operation at a high speed, and including a rewritable nonvolatile memory cell.

Figure 2:
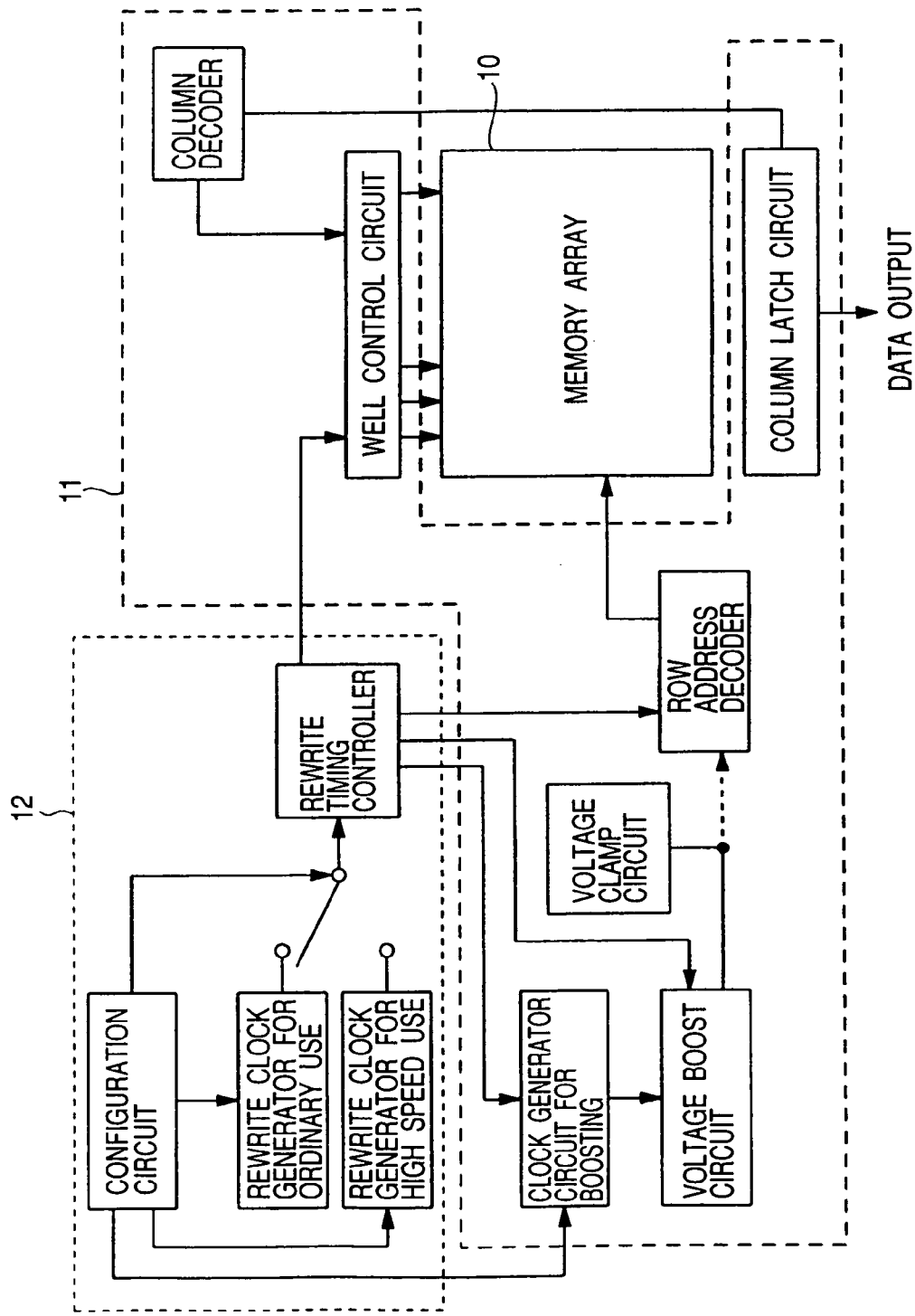
FIG. 2 is a block diagram illustrating the constitution of EEPROM.
Figure 3:
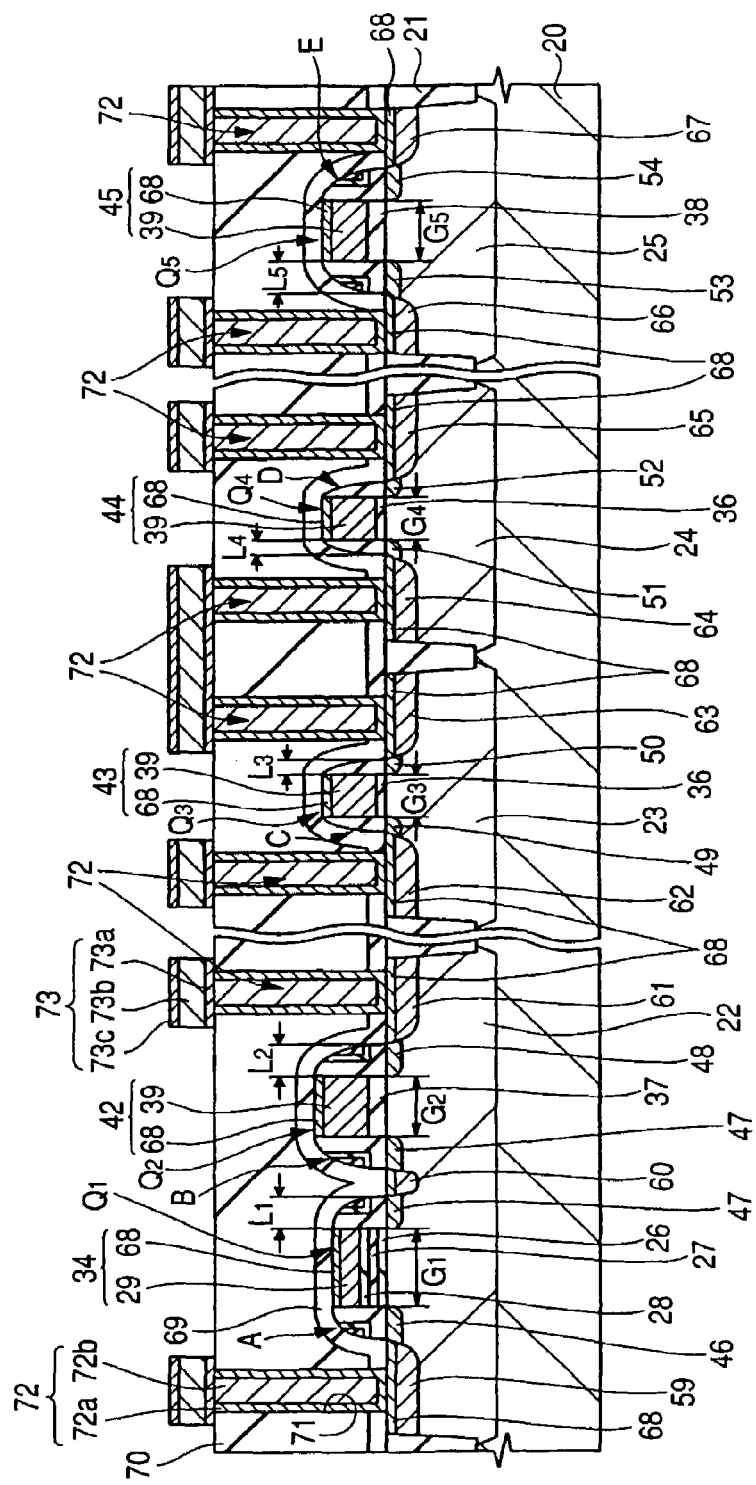
FIG. 3 is a cross-sectional view of a semiconductor device according to Embodiment 1 of the present invention.

Referring to FIGS. 1 to 3, the constitution of the semiconductor device according to Embodiment 1 will be described.

FIG. 1 is a top view illustrating the layout of elements formed over a chip (semiconductor substrate) 1. In FIG. 1, the chip 1 has a CPU (Central Processing Unit) 2, ROM (Read Only Memory) 3, RAM (Random Access Memory) 4, EEPROM (Electrically Erasable Programmable Read Only Memory) 5, analog circuit 6, and electrostatic protection circuits 7a to 7g.

The CPU (circuit) 2 is commonly known as a central processing unit and is the heart of a computer. This CPU 2 reads instructions from a memory device, and, based on the execution thereof, a variety of operations or controls are performed. High-speed processing is required for this purpose. An MIS transistor constituting the CPU 2, among the elements formed over the chip 1, needs a relatively high current driving capability. In other words, the CPU 2 is formed of a low voltage MIS transistor.

The ROM (circuit) 4 is a memory which stores data in permanent form with no ability to alter the data. It is commonly known as a read only memory. The ROM 3 has two types of constitution, that is, an NAND type in which MIS transistors are connected in series and an NOR type in which MIS transistors are connected in parallel. The NAND type is used when a high degree of integration is required, while the NOR type is used when a high operation speed is required. A high speed operation is necessary also for this ROM 3, so that MIS transistors constituting the ROM 3 must have a relatively high current driving capability. In other words, the ROM 3 is formed of low voltage MIS transistors.

The RAM (circuit) 4 is a memory that is capable of reading the stored data or writing new data at random, in other words, independent of the timing. It is commonly known as a random access memory. The RAM as an IC memory is available in two types, that is, a DRAM (Dynamic RAM) using a dynamic circuit and a SRAM (Static RAM) using a static circuit. A DRAM is a random access memory which needs a memory retaining operation, while a SRAM is a random access memory which does not need a memory retaining operation. Since the RAM 4 needs a high speed operation, the MIS transistors constituting the RAM 4 need a relatively high current driving capability. In other words, the RAM 4 is formed of low voltage MIS transistors.

The EEPROM 5 is one type of nonvolatile memory capable of electrically rewriting so as to enable writing and erasing operations. It is also commonly known as an electrically erasable programmable read only memory. The memory cell of this EEPROM 5 has an MIS transistor for memory cell selection, such as a MONOS (Metal Oxide Nitride Oxide Semiconductor) transistor or a MNOS (Metal Nitride Oxide Semiconductor) transistor for memory. The MIS transistor for memory cell selection is formed of a high voltage MIS transistor. The EEPROM 5 makes use of, for example, the injection of hot electrons or the Fowler-Nordheim tunneling phenomenon during a writing operation, and the Fowler-Nordheim tunneling phenomenon or injection of hot holes during an erasing operation. It is needless to say that the injection of hot electrons and injection of hot holes can be reversed.

Upon writing to the EEPROM 5, a high potential difference (about 12V) is produced in the MONOS transistor for memory so that a relatively high voltage transistor is necessary as the MONOS transistor for memory.

The analog circuit 6 is a circuit handling signals of a voltage or current which show a continuous change with the passage of time, that is, analog signals. It has, for example, an amplification circuit, conversion circuit, modulation circuit, oscillation circuit and power supply circuit. For these analog circuits 6, a relatively high voltage MIS transistor, among the elements formed over the chip 1, is employed.

Electrostatic protection circuits 7a to 7g are circuits installed on an external terminal in order to protect against the destruction of internal circuits which otherwise occurs because elements or insulating films are damaged by a voltage or heat generated upon discharge from electrified charges. Examples of the charges include electrostatic charges accumulated in the body or substance of the device. The electrostatic protection circuits 7a, 7c are installed on an input/output terminal, while the electrostatic protection circuit 7b is installed on a monitor terminal. The electrostatic protection circuit 7d is installed on a Vss terminal, while the electrostatic protection circuit 7e is installed on a CLK (clock) terminal. The electrostatic protection circuit 7f is installed on an RST (reset) terminal, while the electrostatic protection circuit 7g is installed on a Vcc terminal. Since a high voltage is applied to these electrostatic protection circuits 7a to 7g, a MIS transistor having a relatively high breakdown voltage, among the elements formed over the chip 1, is employed for them.

One example of the internal constitution of the EEPROM 5 shown in FIG. 1 is illustrated in FIG. 2. In FIG. 2, the EEPROM 5 has a memory array 10; and, as a drive circuit for driving the memory array 10, they are a direct peripheral circuit unit 11 and an indirect peripheral circuit unit 12.

The memory array 10 is a memory portion of the EEPROM 5, and it has a number of memory cells arranged in a two-dimensional matrix form. A memory cell is a circuit for storing 1 bit as a unit of information, and it is composed of an MONOS transistor which is a memory portion and an MIS transistor for selecting a memory cell from the memory array.

The drive circuit is a circuit for driving the memory array 10; and it has, as the direct peripheral circuit unit 11, a voltage boost circuit for boosting the level of voltage from a power supply by several times, a clock generator circuit for the voltage boost circuit, a voltage clamp circuit, a column decoder or row decoder for selecting a row or column, a column latch circuit and a WELL control circuit. The MIS transistors constituting the direct peripheral circuit unit 11 require a relatively high breakdown voltage relative to the other elements formed over the chip 1.

The indirect peripheral circuit unit 12 is formed as a rewriting controller circuit of a memory array, and it has a configuration circuit, a rewrite clock generator for ordinary use, a rewrite clock generator for high speed use, and a rewrite timing controller circuit. The MIS transistors constituting the indirect peripheral circuit unit 12 are formed of low voltage MIS transistors which work at a low voltage relative to that of the other elements formed over the chip 1.

FIG. 3, is a cross-sectional view of the MONOS transistor $Q_1$ and MIS transistors $Q_2$ to $Q_5$ formed over the chip 1. In FIG. 3, a region seen on the left side is a memory cell formation region in the EEPROM (rewritable nonvolatile memory) 5 in which the MONOS transistor $Q_1$ and the MIS transistor $Q_2$ have been formed. The central region is a region in which the low voltage MIS transistors $Q_3$ and $Q_4$ requiring a high current driving capability to attain high speed operation have been formed. As described above, the formation regions of the CPU 2 and RAM 4 can be given as examples of the central region in which such low voltage MIS transistors have been formed. A region seen on the right side in FIG. 3 is a region in which a high voltage MIS transistor $Q_5$ has been formed. Examples of it include the formation region of the analog circuit 6, the formation regions of electrostatic protection circuits 7a to 7g and the region in the EEPROM 5 in which the drive circuit has been formed.

In each region of the semiconductor substrate 20 of the chip 1, element isolation regions 21 for isolating elements are formed. In active regions isolated by the element isolation regions 21, p wells 22, 23 and 25, and an n well 24 are formed.

Over the p well 22 of the memory cell formation region, the MONOS transistor $Q_1$ and MIS transistor $Q_2$ are formed. The MONOS transistor $Q_1$ used for storing 1 bit, and the MIS transistor $Q_2$ is a transistor for selecting a memory cell.

Over the p well 23 in the central region, the MIS transistor $Q_3$ is formed, while the MIS transistor $Q_4$ is formed over the n well 24. These MIS transistors $Q_3$ and $Q_4$ are low voltage MIS transistors which have a higher current driving capability in order to accomplish a higher speed operation than the high voltage MIS transistors $Q_2$ and $Q_5$.

Over the p well 25 in a region on the right side, the MIS transistor $Q_5$ is formed. This MIS transistor $Q_5$ is improved in high breakdown voltage compared with the low voltage MIS transistors $Q_3$ and $Q_4$.

The constitution of the MONOS transistor $Q_1$ and MIS transistors $Q_2$ to $Q_5$ illustrated in FIG. 3 will be described next.

First, the MONOS transistor $Q_1$ formed in the memory cell formation region has a constitution as follows. Specifically, a gate insulating film (first gate insulating film) 26 is formed over the p well 22 formed in the semiconductor substrate 20 and a charge storage film 27 is formed over this gate insulating film 26. Over the charge storage film 27, an insulating film 28 (intermediate insulating film) is formed, and over this insulating film 28, a memory gate electrode (first gate electrode) 34 made of a conductive film is formed. The memory gate electrode 34 has a stack structure in which a cobalt silicide film 68, for example, has been formed as a silicide film over a polysilicon film 29 for attaining resistance reduction. Over the sidewalls of the memory gate electrode 34, sidewall spacers (first sidewall spacers) A, which are made of, for example, an insulating film, are formed to constitute an LDD (Lightly Doped Drain) structure. It is needless to say that the silicide film is not limited to cobalt silicide, but may be formed of nickel silicide.

In the semiconductor substrate 20 below the sidewall spacers A, there are low-concentration n-type-impurity diffusion regions (first impurity regions) 46 and 47; and, outside thereof, high-concentration n-type-impurity diffusion regions (second impurity regions) 59 and 60 are formed as semiconductor regions. Over the high-concentration n-type-impurity diffusion regions 59 and 60, a cobalt silicide film 68, for example, is formed as a silicide film for lowering the resistance.

In the MONOS transistor $Q_1$ thus constituted, the gate insulating film 26 is formed, for example, of a silicon oxide film, and it also functions as a tunnel insulating film. For example, this MONOS transistor $Q_1$ stores or erases data by injecting electrons from the semiconductor substrate 20 to the charge storage film 27 via the gate insulating film 26, or discharging the electrons thus accumulated in the charge storage film 27 to the semiconductor substrate 20. The gate insulating film 26 therefore functions as a tunnel insulating film. Writing, erasing and reading operations of the memory cell using such tunnel effects of electrons will be described later in detail.

The charge storage film 27 is formed to accumulate charges contributing to the storage of data, and it is formed, for example, of a silicon nitride film.

Conventionally, a polysilicon film is mainly used as the charge storage film 27. When a polysilicon film is used as the charge storage film 27, however, a partial defect in an oxide film encompassing the charge storage film 27 causes abnormal leakage, because the charge storage film 27 is a conductor. This presumably results in the disappearance of all the charges accumulated in the charge storage film 27.

As described above, a silicon nitride film which is an insulator has therefore come to be used as the charge storage film 27. In this case, charges contributing to the data storage are accumulated in the discrete trap level existing in the silicon nitride film. Even if a partial defect appears in the oxide film encompassing the charge storage film 27, all the charges do not leak from the charge storage film 27 because they are stored in the discrete trap level of the charge storage film 27. This makes it possible to improve the reliability of data retention.

For the above-described reason, the reliability of data retention can be improved by using, as the charge storage film 27, a film including a discrete trap level, as well as a silicon nitride film.

The sidewall spacers A are formed so as to form a source region (first source region) and a drain region (first train region), which are semiconductor regions of the MONOS transistor $Q_1$, as an LDD structure. More specifically, the source region of the MONOS transistor $Q_1$ has a low-concentration n-type-impurity diffusion region 46 and a high-concentration n-type-impurity diffusion region 59, while its drain region has a low-concentration n-type-impurity diffusion region 47 and a high-concentration n-type-impurity diffusion region 60. The electric field concentration below the end of the memory gate electrode 34 can be suppressed by forming the source region and drain region below the sidewall spacers A as low-concentration n-type-impurity diffusion regions 46 and 47.

The constitution of the MIS transistor $Q_2$ will be described next. In FIG. 3, the MIS transistor $Q_2$ has a constitution as follows. Specifically, a gate insulating film (third gate insulating film) 37 is formed over the p well 22; and, over this gate insulating film 37, a control gate electrode (third gate electrode) 42 is formed. The control gate electrode 42 has a polysilicon film 39, and, in addition, a cobalt silicide film 68 is formed thereover as a silicide film for lowering the resistance.

Over the sidewalls of the control gate electrode 42, sidewall spacers (third sidewall spacers) B are formed for constituting the source region and drain region of the MIS transistor $Q_2$ as an LDD structure. Outside of the low-concentration n-type-impurity diffusion regions 47 and 48, high-concentration n-type-impurity diffusion regions 60 and 61, which are semiconductor regions, are formed.

Next, the constitution of the low voltage MIS transistor $Q_3$ requiring a relatively high current driving capability will be described. In FIG. 3, the MIS transistor $Q_3$ has the following structure. More specifically, a gate insulating film (second insulating film) 36 is formed over the p well 23 and over this gate insulating film 36, a gate electrode (second gate electrode) 43 is formed. This gate electrode 43 is formed of a polysilicon film 39 having an n type impurity, such as phosphorus (P), introduced therein, and a cobalt silicide film 68 formed over the polysilicon film 39 for reducing the resistance. The length of the gate electrode 43 in the gate length direction is shorter than the length of the respective gate electrodes 34 and 42 of the MONOS transistor $Q_1$ and MIS transistor $Q_2$ in the gate length direction. The silicide film is, for example, a film made of cobalt silicide, titanium silicide or nickel silicide.

Over the sidewalls of the gate electrode 43, sidewall spacers (second sidewall spacers) C are formed, and the width thereof in the gate length direction is smaller than the width of each of the sidewall spacers A and B. Below the sidewall spacers C, low-concentration n-type-impurity diffusion regions (third impurity regions) 49 and 50, which are semiconductor regions, are formed. Outside the low-concentration n-type-impurity diffusion regions 49 and 50, high-concentration n-type-impurity diffusion regions (fourth impurity regions) 62 and 63 are formed. As described above, in the MIS transistor $Q_3$, source regions (second source regions) made of the low-concentration n-type-impurity diffusion region 49 and high-concentration n-type-impurity diffusion region 62 and drain regions (second drain regions) made of the low-concentration n-type-impurity diffusion region 50 and high-concentration n-type-impurity diffusion region 63 are formed.

The MIS transistor $Q_4$ has the gate insulating film 36 formed over the n well 24, a gate electrode (second gate electrode) 44, sidewall spacers (second sidewall spacers) D, source regions made of a low-concentration p-type-impurity diffusion region 51 and a high-concentration p-type-impurity diffusion region 64, and drain regions made of a low-concentration p-type-impurity diffusion region 52 and a high-concentration p-type-impurity diffusion region 65. This gate insulating film 36 is formed, as will be described later, in the same step with that employed for the formation of the gate insulating film 36 of the MIS transistor $Q_3$. The gate electrode 44 is made of a polysilicon film 39 having a p type impurity, such as boron (B), introduced therein, and a cobalt silicide film 68. As in the MIS transistor $Q_3$, the length of the gate electrode 44 in the gate length direction is shorter than that of the respective gate electrodes 34 and 42 of the MONOS transistor $Q_1$ and MIS transistor $Q_2$, because, as described above, the channel length of the MIS transistor $Q_3$ must be designed as short as possible in order to attain high speed operation. The sidewall spacers D are formed in the same step with that employed for the formation of the sidewall spacers C of the MIS transistor $Q_3$, and the width thereof in the gate length direction is smaller than the width of each of the sidewall spacers A and B. The source and drain regions of the MIS transistor $Q_4$ are formed in the n well 24 in alignment with the sidewall spacers D; and, as described above, they have low-concentration p-type-impurity diffusion regions 51 and 52 and high-concentration p-type-impurity diffusion regions 64 and 65.

The MIS transistor $Q_5$ has the gate insulating film 38 formed over the p well 25, a gate electrode (fourth gate electrode) 45, sidewalls (fourth sidewalls) E, source regions made of a low-concentration n-type-impurity diffusion region 53 and a high-concentration n-type-impurity diffusion region 66, and drain regions made of a low-concentration n-type-impurity diffusion region 54 and a high-concentration n-type-impurity diffusion region 67. This gate insulating film 36 is formed, as will be described later, in the same step with that employed for the formation of the gate insulating film 37 of the MIS transistor $Q_2$. The gate electrode 45 is made of a polysilicon film 39 having, for example, an n type impurity introduced therein and a cobalt silicide film 68. The length of the gate electrode 45 in the gate length direction is longer than that of the respective gate electrode 43 and 44 of the MIS transistor $Q_3$ and MIS transistor $Q_4$. The sidewall spacers E are formed in the same step with that employed for the formation of the sidewall spacers A and B of the MONOS transistor $Q_1$ and MIS transistor $Q_2$, and the width thereof in the gate length direction is wider than the width of each of the sidewall spacers C and D. The source and drain regions of the MIS transistor $Q_5$ are formed in the p well 25 in alignment with the sidewall spacers E; and, as described above, they have low-concentration n-type-impurity diffusion regions 53 and 54 and high-concentration n-type-impurity diffusion regions 66 and 67.

The difference among the MONOS transistor $Q_1$ and the MIS transistors $Q_2$ to $Q_5$ will be described.

The first difference among the MONOS transistor $Q_1$ and the MIS transistors $Q_2$ to $Q_5$ with respect to their constitution is the width of the sidewall spacers.

As illustrated in FIG. 3, the width of the sidewall spacers A of the MONOS transistor $Q_1$, the width of the sidewall spacers B of the MIS transistor $Q_2$, the width of the sidewall spacers C of the MIS transistor $Q_3$, the width of the sidewall spacers D of the MIS transistor $Q_4$ and the width of the sidewall spacers E of the MIS transistor $Q_5$ are defined as $L_1$, $L_2$, $L_3$, $L_4$ and $L_5$, respectively.

As is apparent from FIG. 3, the widths $L_1$, $L_2$ and $L_5$ of the sidewall spacers A, B and E of the MONOS transistor $Q_1$ for memory and the MIS transistors $Q_2$ and $Q_5$ are wider than the width $L_3$ of the sidewall spacers C of the MIS transistor $Q_3$ and the width $L_4$ of the sidewall spacers D of the MIS transistor $Q_4$, each requiring a current driving capability. In the low voltage MIS transistors $Q_3$ and $Q_4$ requiring a relatively high current driving capability, the resistance between the source region (second source region) and the drain region (second drain region) is lowered by narrowing the widths $L_3$ and $L_4$ of the sidewall spacers C and D and thereby shrinking the distance between the source region and drain region. In short, the resistance between the source region and the drain region is lowered to improve the current driving capability. In this manner, a high speed operation of the MIS transistors $Q_3$ and $Q_4$ can be attained. In addition, since the respective widths $L_1$, $L_2$ and $L_5$ of the sidewall spacers A, B and E are formed to be greater than the widths $L_3$ and $L_4$ of the sidewall spacers C and D, it is possible to form the length, in the gate length direction, of the low-concentration n-type-impurity regions 46, 47, 48, 53 and 54, that are formed for the MONOS transistor $Q_1$ and MIS transistors $Q_2$ to $Q_5$, to be shorter than the length, in the gate length direction, of the low-concentration n-type-impurity regions 49 and 50 and low-concentration p-type-impurity regions 51 and 52, that are formed for the MIS transistors $Q_3$ and $Q_4$. Thus, by widening the widths $L_1$, $L_2$ and $L_5$ of the sidewall spacers A, B and E, the breakdown voltage of a pn junction between the source region and the semiconductor substrate or between the drain region and the semiconductor substrate can been enhanced.

The widths $L_1$, $L_2$ and $L_5$ of the sidewall spacers A, B and E of the MONOS transistor $Q_1$ and MIS transistors $Q_2$ and $Q_5$ are each, for example, about 190 nm, while the widths $L_3$ and $L_4$ of the sidewall spacers C and D of the MIS transistors $Q_3$ and $Q_4$ are each, for example, about 120 nm.

Figure 4:
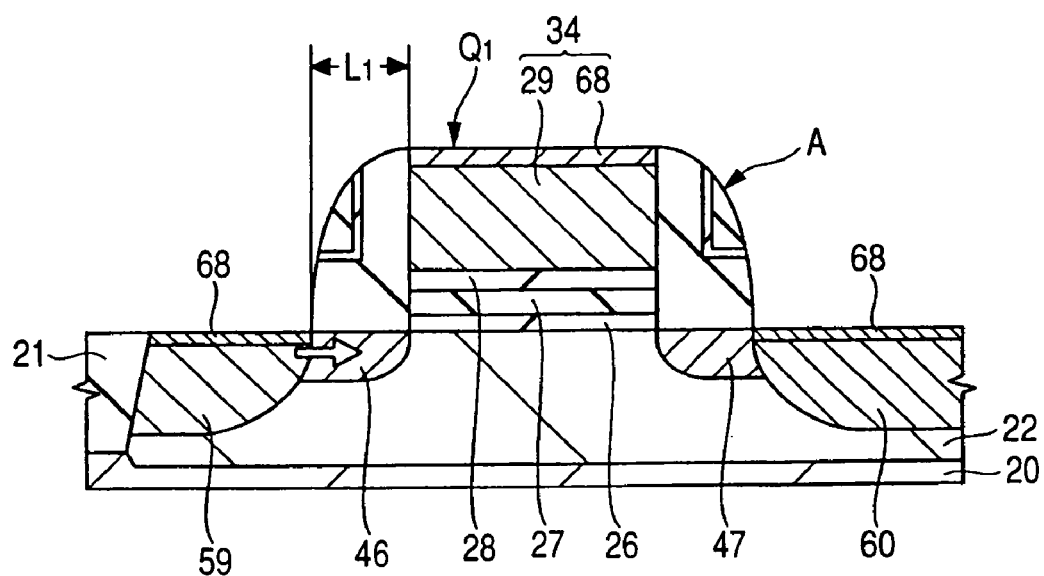
FIG. 4 is an enlarged section view of a MONOS transistor in FIG. 3.

With the MONOS transistor $Q_1$ as an example, an enhancement of the breakdown voltage of the pn junction brought about by the widening of the width $L_1$ of the sidewall spacer A will be described in reference to FIG. 4. FIG. 4 illustrates the MONOS transistor $Q_1$ for memory. In FIG. 4, the MONOS transistor $Q_1$ for memory has an LDD structure. More specifically, the source region and drain region are made of low-concentration n-type-impurity diffusion regions 46 and 47 and high-concentration n-type-impurity diffusion regions 59 and 60. In a region near the memory gate electrode 34, the low-concentration n-type-impurity diffusion regions 46 and 47 are formed. The low-concentration n-type-impurity diffusion regions 46 and 47 are formed in a region near the memory gate electrode 34 for the purpose of preventing electric field concentration in a region below both edges of the memory gate electrode 34. The number of carriers is less in the low-concentration n-type-impurity diffusion regions 46 and 47 than in the high-concentration n-type-impurity diffusion regions 59 and 60. In the former regions, passage of a current is not smooth and the resistance is therefore higher than that of the high-concentration n-type-impurity diffusion regions 59 and 60. This makes it possible to enhance the gate breakdown voltage between the source and drain regions. In addition, the depletion layer near the low-concentration n-type-impurity diffusion regions 46 and 47 can be extended so that an electric field at the end of the low-concentration n-type-impurity diffusion region 47, which is to be a drain region, can be relaxed.

The boundaries between the low-concentration n-type-impurity diffusion regions 46 and 47 and the high-concentration n-type-impurity diffusion regions 59 and 60 are defined by the width $L_1$ of the sidewall spacers A.

The low-concentration n-type-impurity diffusion regions 46 and 47 and the high-concentration n-type-impurity diffusion regions 59 and 60 are each formed, for example, by ion implantation. After ion implantation, heat treatment is performed to activate the ions thus implanted. Particularly by the heat treatment performed upon formation of the high-concentration n-type-impurity diffusion regions 59 and 60, the ions thus implanted are diffused into the low-concentration n-type-impurity diffusion regions 46 and 47. Some of the ions implanted transfer from the high-concentration n-type-impurity diffusion regions 59 and 60 to the low-concentration n-type-impurity diffusion regions 46 and 47, as indicated by the arrow of FIG. 4.

As the width $L_1$ of the sidewall spacers A is made narrower than that illustrated in FIG. 4, the high-concentration n-type-impurity diffusion regions 59 and 60 approach a region below the edges of the memory gate electrode 34. Then, ions transfer even to a region below the edges of the memory gate electrode 34 at which an electric field concentration tends to occur. By a rise in the impurity concentration in a region below the edges, an electric field concentration occurs, leading to lowering of the breakdown voltage of the pn junction between the source region and semiconductor substrate or between the drain region and the semiconductor substrate.

In the semiconductor device according to Embodiment 1, the width $L_1$ of the sidewall spacers A of the MONOS transistor $Q_1$ for memory is wider than each of the widths $L_3$ and $L_4$ of the sidewall spacers C and D of the low voltage MIS transistors $Q_3$ and $Q_4$. This relatively widens the distance between the high-concentration n-type-impurity diffusion regions 59 and 60 and a region below the edges of the memory gate electrode 34. Ions therefore do not easily reach the region below the edges, making it possible to enhance the breakdown voltage of the pn junction of the MONOS transistor $Q_1$ for memory compared with that of the MIS transistors $Q_3$ and $Q_4$. In other words, the breakdown voltage of the pn junction between the source region (first source region) and the semiconductor substrate or between the drain region (first drain region) and the semiconductor substrate in the MONOS transistor $Q_1$ can be made greater than that between the source region (second source region) and semiconductor substrate or the drain region (second drain region) and the semiconductor substrate of the MIS transistors $Q_3$ and $Q_4$.

Supposing that the width $L_1$ of the sidewall spacers A is made almost equal to each of the widths $L_3$ and $L_4$ of the sidewall spacers C and D of the MIS transistors $Q_3$ and $Q_4$, the widths of the low-concentration n-type-impurity diffusion regions 46 and 47, which are high-resistance regions, become small, which facilitates the passage of a current in the vicinity of the surface of the semiconductor substrate and, in turn, the occurrence of an electric field concentration below the edges of the memory gate electrode 34. By the occurrence of such an electric field concentration, holes (hot holes) having a high energy appear in some of the carriers which have become concentrated on the edge portions of the memory gate electrode 34. When a voltage is applied to the memory gate electrode 34, such hot holes tend to be attracted by the voltage and injected into the charge storage layer, which inevitably causes a problem, such as accidental erasing of data. A voltage applied to the memory gate electrode 34 of the MONOS transistor $Q_1$ for memory is higher than that applied to the low voltage MIS transistors $Q_3$ and $Q_4$, so that an electric field concentration tends to occur in the former case. In order to avoid such a problem, the sidewall spacers A of the MONOS transistor $Q_1$ for memory is formed to have a greater width $L_1$ than the widths $L_3$ and $L_4$ of the sidewall spacers C and D of the low voltage MIS transistors $Q_3$ and $Q_4$.

In the semiconductor device according to Embodiment 1, the electrical properties of each element can be improved. Since only a relatively low voltage (about 1.5V) is applied to the MIS transistors $Q_3$ and $Q_4$ upon operation, improvement in high speed operation is intended by relatively narrowing the widths $L_3$ and $L_4$ of the sidewall spacers C and D. On the other hand, a relatively high potential difference (about 1.2 V) appears in the MONOS transistor $Q_1$ for memory during an operation such as writing, so that the reliability of the writing operation or the like is improved by relatively widening the width $L_1$ of the sidewall spacers A and thereby enhancing the breakdown voltage of the pn junction between the source and semiconductor substrate or between the drain and semiconductor substrate.

The MIS transistor $Q_5$ is a high voltage MIS transistor so that the width $L_5$ of the sidewall spacers E is equal to the width $L_1$ of the sidewall spacers A of the MONOS transistor $Q_1$. The width $L_2$ of the sidewall spacers B of the MIS transistor $Q_2$ is also equal to the width $L_1$ of the sidewall spacers A of the MONOS transistor $Q_1$.

The second difference among the MONOS transistor $Q_1$ and the MIS transistors $Q_2$ to $Q_5$ with respect to their constitution is the gate length.

As illustrated in FIG. 3, the gate length of-the MONOS transistor $Q_1$ and the gate lengths of the MIS transistors $Q_2$ to $Q_5$ are defined as $G_1$ and $G_2$ to $G_5$, respectively. In FIG. 3, the gate lengths $G_3$ and $G_4$ of the MIS transistors $Q_3$ and $Q_4$ are shorter than any of the others in order to reduce the resistance between the source region and drain region and thereby improve the current driving capability.

The gate length $G_1$ of the MONOS transistor $Q_1$ is the longest of all, because, if it is almost equal to the gate lengths $G_3$ and $G_4$ of the MIS transistors $Q_3$ and $Q_4$, punch-through occurs between the source region and drain region because a voltage of about 12V is applied to the MONOS transistor $Q_1$.

The gate lengths $G_2$ and $G_5$ of the MIS transistors $Q_2$ and $Q_5$ are each greater than the gate lengths $G_3$ and $G_4$ but less than the gate length $G_1$. If expressed numerically, for example, the gate length $G_1$ of the MONOS transistor $Q_1$ is about 0.60 µm, the gate length $G_2$ of the MIS transistor $Q_2$ for memory selection is about 0.40 µm, the gate lengths $G_3$ and $G_4$ of the MIS transistors $Q_3$ and $Q_4$ are each about 0.16 µm and the gate length $G_5$ of the MIS transistor $Q_5$ is about 0.40 µm.

In the semiconductor device according to Embodiment 1, punch-through can be prevented by forming the gate length $G_1$ of the MONOS transistor $Q_1$ with a relatively long length. In other words, a relatively high voltage is applied to the memory gate electrode 34 of the MONOS transistor $Q_1$ so that the transistor must have a sufficiently long gate length. In addition, the current driving capability of the MIS transistors $Q_3$ and $Q_4$ can be improved by forming the gate length $G_3$ and $G_4$ with a relatively short length, meaning that the MIS transistors $Q_3$ and $Q_4$ are formed with a gate length that is as small as possible, because a relatively low voltage is applied to them to attain high speed operation. In other words, prevention of punch-through of the MONOS transistor $Q_1$ and, at the same time, improvement in the current driving capability of the MIS transistors $Q_3$ and $Q_4$ can be attained by forming a channel (first channel) below the gate electrode 34 of the MONOS transistor $Q_1$ so as to be longer than the channels (second channels) below the gate electrodes 43 and 44 of the MIS transistors $Q_3$ and $Q_4$.

The third difference among the MIS transistors $Q_2$ to $Q_5$ with respect to their constitution is the thickness of the gate insulating film.

In FIG. 3, a higher voltage is applied to the MIS transistors $Q_2$ and $Q_5$ compared with the MIS transistors $Q_3$ and $Q_4$ so that the gate insulating films 37 and 38 are thicker than the gate insulating film 36 of the MIS transistors $Q_3$ and $Q_4$. Such a constitution makes it possible to enhance the breakdown voltage of the gate insulating film 38 of the MIS transistors $Q_2$ and $Q_5$.

The semiconductor device according to Embodiment 1 has a constitution as described above. One example of the operation in an electrically rewritable nonvolatile memory cell having a MONOS transistor $Q_1$ and a MIS transistor $Q_2$ will be described briefly with reference to FIGS. 3, 5 and 6.

Figures 5, 6:
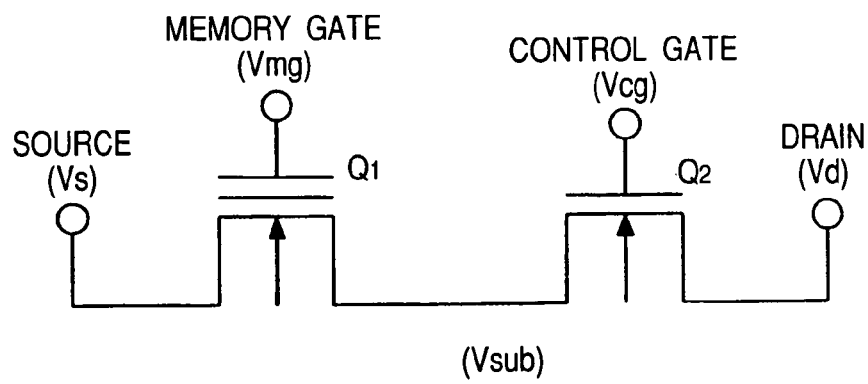
FIG. 5 is an equivalent circuit diagram of a transistor circuit in a memory cell.
FIG. 6 is a table which shows a voltage applied to each site upon operation of a memory cell.

In FIG. 5, an element seen on the left side is the MONOS transistor $Q_1$ of FIG. 3, while that seen on the right side is the MIS transistor $Q_2$ for memory selection.

In FIG. 6, the voltages applied to a source region (high-concentration n-type-impurity diffusion region 59 (first semiconductor region)), memory gate electrode 34, control gate electrode 42, drain region (high-concentration n-type-impurity diffusion region 61) and semiconductor substrate 20 upon writing, erasing or reading in a rewritable nonvolatile memory cell are indicated as Vs, Vmg, Vcg, Vd and Vsub, respectively.

A writing operation will be described first. In this case, a voltage of about 1.5V is applied to the memory gate electrode 34 and control gate electrode 42, while a voltage of about −10.5V is applied to the source region (high-concentration n-type-impurity diffusion region 59), drain region (high-concentration n-type-impurity diffusion region 61) and semiconductor substrate 20. This turns the MIS transistor $Q_2$ on, and the memory cell thereof is selected. Owing to a potential difference of about +12V between the memory gate electrode 34 of the MONOS transistor $Q_1$ and the semiconductor substrate 20, electrons in the semiconductor substrate 20 tunnel through the gate insulating film 26 and are stored in a trap level of the charge storage film 27. In this manner, the writing operation proceeds.

An erasing operation will be described next. In this case, a voltage of about 1.5V is applied to the source region (high-concentration n-type-impurity diffusion region 59), control gate electrode 42, drain region (high-concentration n-type-impurity diffusion region 61) and semiconductor substrate 20, while a voltage of about −8.5V is applied to the memory gate electrode 34. This turns the MIS transistor $Q_2$ on, and the memory cell thereof is selected. Electrons stored in the charge storage film 27 of the MONOS transistor $Q_1$ tunnel through the gate insulating film 26 and transfer into the semiconductor substrate 20. By the application of about −8.5V to the memory gate electrode 34 and about 1.5V to the semiconductor substrate 20, the potential difference of the semiconductor substrate 20 relative to the memory gate electrode 34 is about +10V. Electrons stored in the charge storage film 27 are drawn into the semiconductor substrate 20, while the holes are accumulated in the charge storage film 27.

A reading operation will be described next. In this case, a voltage of about 0V is applied to the source region (high-concentration n-type-impurity diffusion region 59), memory gate electrode 34, and semiconductor substrate 20, while voltages of about −2.0V and about 0.8V are applied to the control gate electrode 42 and the drain electrode, respectively. This turns the MIS transistor $Q_2$ on, and the memory cell thereof is selected. When electrons are stored in the charge storage film 27 of the MONOS transistor $Q_1$, the threshold voltage of the MONOS transistor $Q_1$ exceeds 0V, so that no current passes between the source electrode and the drain electrode when about 0V is applied to the memory gate electrode. When holes are accumulated in the charge storage film 27 of the MONOS transistor $Q_1$ (including the case where the charges are not stored), on the other hand, the threshold voltage of the MONOS transistor $Q_1$ becomes 0V or less, leading to no passage of a current between the source electrode and the drain electrode when about 0V is applied to the memory gate electrode. Thus, 1 bit of information can be stored, depending on the passage of a current.

A method of manufacture of the semiconductor device of Embodiment 1 will be described next based on the accompanying drawings.

Figure 7:
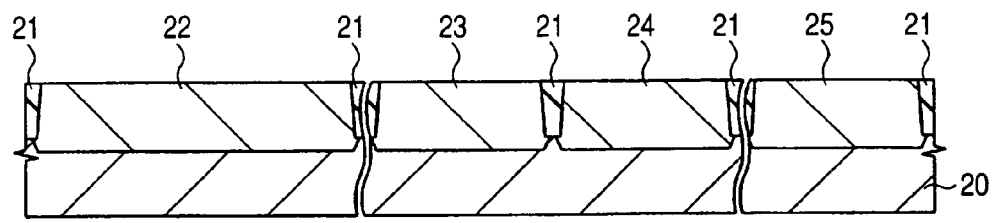
FIG. 7 is a cross-sectional view illustrating a step in the manufacture of the semiconductor device according to Embodiment 1 of the present invention.

As illustrated in FIG. 7, a semiconductor substrate 20, obtained by introducing a p type impurity, such as boron, (B) into single crystal silicon, is prepared. Then, an element isolation region 21 is formed over the main surface of the semiconductor substrate 20. This element isolation region 21 is made of, for example, a silicon oxide film, and it is formed by STI (Shallow Trench Isolation) or LOCOS (Local Oxidization of Silicon). FIG. 7 illustrates the element isolation region 21 formed by the STI method, that is, by embedding a silicon oxide film in a trench formed in the semiconductor substrate 20.

Over the semiconductor substrate 20, p wells 22, 24 and 25, and an n well 24 are formed. The p wells 22, 23 and 25 are formed by using photolithography and ion implantation and introducing a p type impurity. Examples of the p type impurity to be introduced include boron and boron fluoride. Similarly, the n well 24 is formed by using photolithography and ion implantation and introducing an n type impurity. Examples of the n type impurity include phosphorus and arsenic.

Figure 8:
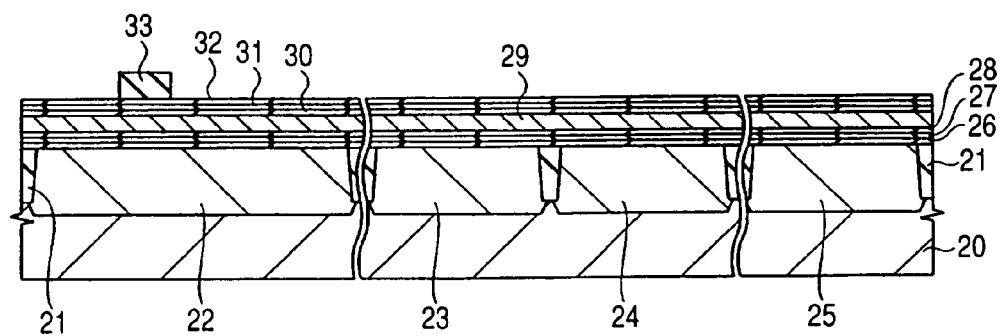
FIG. 8 is a cross-sectional view illustrating a manufacturing step following the step of FIG. 7.

As illustrated in FIG. 8, a gate insulating film (first gate insulating film) 26 is formed over the main surface of the semiconductor substrate 20. The gate insulating film 26 has a thickness of about 1.1 nm. The gate insulating film 26 is made of, for example, a silicon oxide film, and it can be formed by the thermal oxidation method. Over the gate insulating film 26, a charge storage film 27 is formed. The charge storage film 27 is made of, for example, a silicon nitride film, and it can be formed by CVD (Chemical Vapor Deposition) making use of a chemical reaction between a silane gas ($SiH_4$) and an ammonia gas ($NH_3$). Instead, ALD (Atomic Layer Deposition) can be employed for the preparation thereof. The charge storage film 27 has a thickness of about 16.5 nm. A silicon nitride film is used as the charge storage film 27, but not only, it but also a film containing a trap level therein, such as a silicon oxynitride film (SiON), may be used. It is also possible to prepare the charge storage film 27 using Si nanodot.

Over the charge storage film 27, an insulating film 28 is formed. The insulating film 28 is made of, for example, a silicon oxide film and can be formed by CVD making use of chemical reaction between a silane gas and an oxygen gas ($O_2$). The insulating film 28 has a film thickness of about 3.0 nm.

Over the insulating film 28, a polysilicon film 29 is formed. The polysilicon film 29 can be formed, for example, by CVD which makes use of thermal decomposition of a silane gas in a nitrogen gas ($N_2$). Upon formation of the polysilicon film 29, a conduction impurity such as phosphorus is added. Alternatively, the conduction impurity may be injected to the polysilicon film 29 by ion implantation after completion of the formation of the polysilicon film 29.

Over the polysilicon film 29, a cap insulating film is formed. The cap insulating film is made of a film stack consisting of, for example, a silicon oxide film 30, a silicon nitride film 31 and a silicon oxide film 32. These films can be formed, for example, by CVD. The cap insulating film serves to protect a memory gate electrode 34, which will be formed in the later step.

Figure 9:
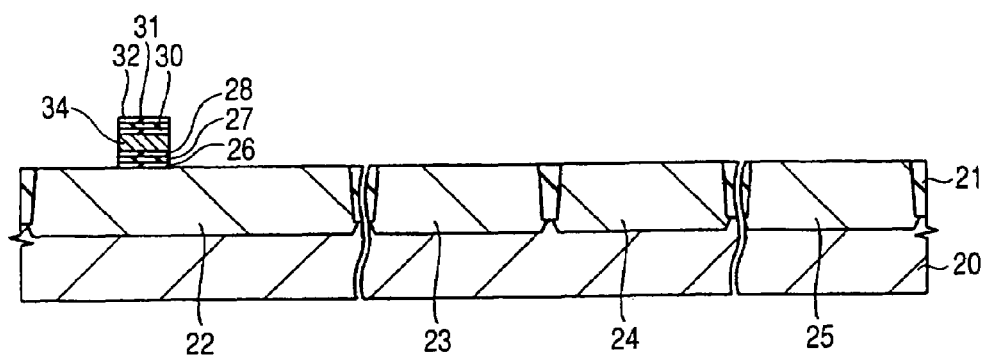
FIG. 9 is a cross-sectional view illustrating a manufacturing step following the step of FIG. 8.

After applying a resist film 33 to the cap insulating film, the resist film 33 is patterned by exposure and development. The patterning is performed to leave the resist film 33 in a region in which the memory gate electrode 34 is to be formed. By etching using the patterned resist film 33 as a mask, the memory gate electrode (first gate insulating film) 34 is formed, as illustrated in FIG. 9.

Figure 10:
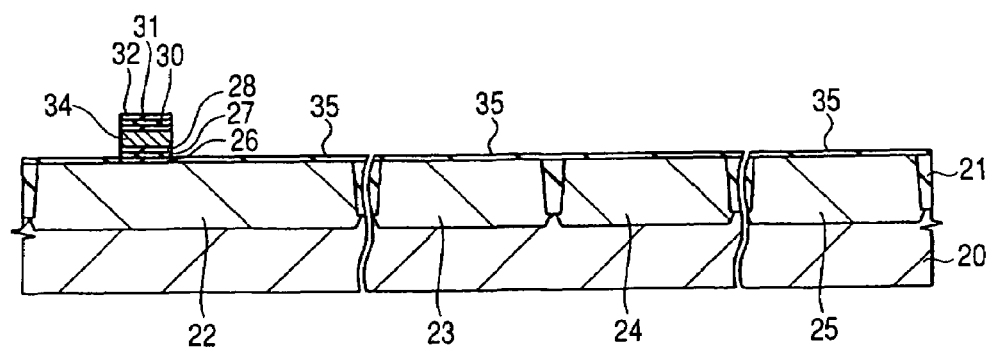
FIG. 10 is a cross-sectional view illustrating a manufacturing step following the step of FIG. 9.
Figure 11:
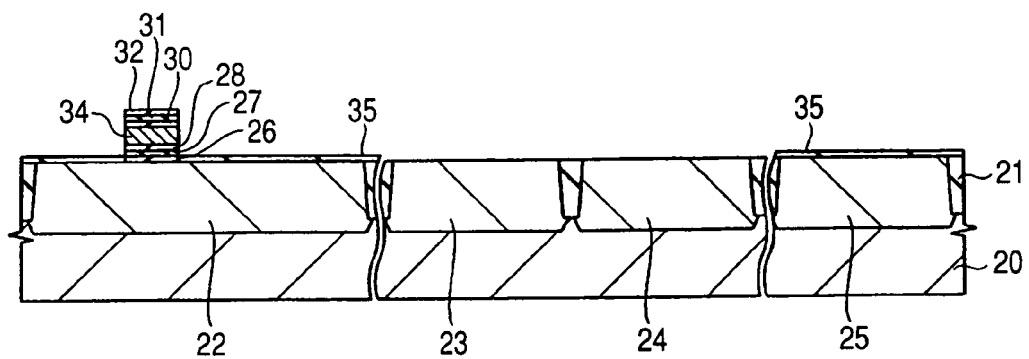
FIG. 11 is a cross-sectional view illustrating a manufacturing step following the step of FIG. 10.

As illustrated in FIG. 10, a gate insulating film 35 is formed over the main surface of the semiconductor substrate 20. The gate insulating film 35 is made of, for example, a silicon oxide film and can be formed by thermal oxidation. Then, as illustrated in FIG. 11, the gate insulating film 35 is removed from a region in which low voltage MIS transistors $Q_3$ and $Q_4$ requiring a relatively great current driving capability (center region of FIG. 10) (second region) are to be formed. For the removal of the gate insulating film 35, photolithography and etching can be employed.

Figure 12:
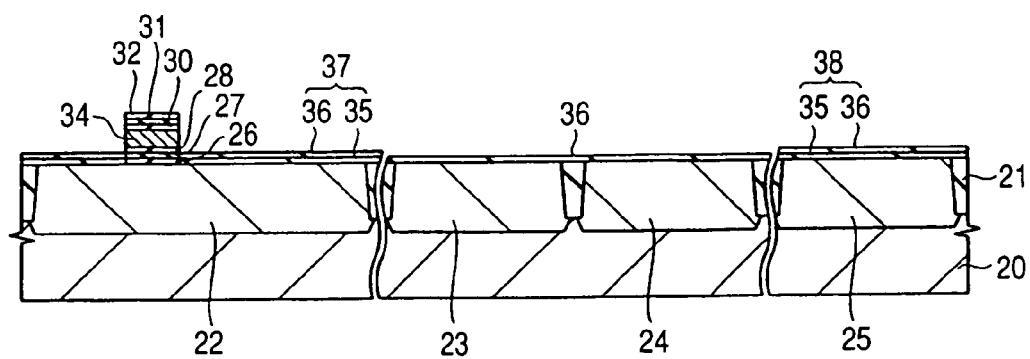
FIG. 12 is a cross-sectional view illustrating a manufacturing step following the step of FIG. 11.

As illustrated in FIG. 12, a gate insulating film (second gate insulating film) 36 is formed over the gate insulating film 35 and semiconductor substrate 20. This gate insulating film 36 can be formed, for example, by CVD. In such a manner, a relatively thick gate insulating film (third insulating film) 37 and gate insulating film 38 can be formed in a memory cell formation region (a region on the left side) (first region) and a region (a region on the right side) in which a high voltage MIS transistor $Q_5$ is to be formed.

The gate insulating film 37 and gate insulating film 38 each has a total thickness of the gate insulating film 35 and gate insulating film 36. In a region in which the low voltage MIS transistors $Q_3$ and $Q_4$ requiring a relatively great current driving capability are to be formed, the insulating film 36 having a relatively small thickness is formed.

A silicon oxide film was used as the gate insulating films 36 to 38, but without limitation, a material having a higher dielectric constant than that of silicon oxide, such as a so-called High-k film, may be used instead. For example, these gate insulating films may be formed, for example, from aluminum oxide, hafnium oxide, zirconium oxide or silicon nitride.

Figure 13:
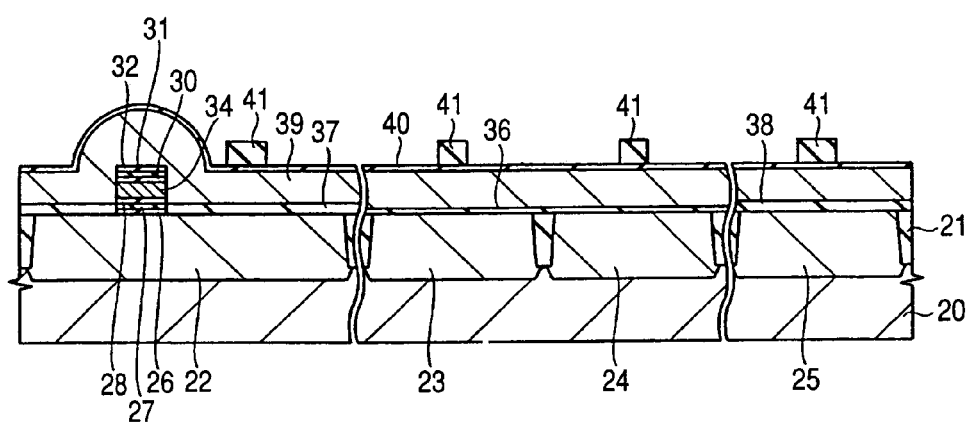
FIG. 13 is a cross-sectional view illustrating a manufacturing step following the step of FIG. 12.

As illustrated in FIG. 13, a polysilicon film (conductor film) 39 is formed as a conductive film over the entire main surface of the semiconductor substrate 20. The polysilicon film 39 can be formed, for example, by CVD as described above. During or after the formation of the polysilicon film 39, a conduction impurity is added thereto. This conduction impurity is introduced in order to lower the resistance of the polysilicon film 39.

Over the polysilicon film 39, a cap insulating film is formed. This cap insulating film has a function of protecting a gate electrode which will be formed in the later step. It is formed, for example, from a silicon oxide film 40. As a method of formation of the silicon oxide film 40, CVD is employed, for example.

After application of a resist film 41 over the silicon oxide film 40, the resist film 41 is patterned by exposure and development. The patterning is performed to leave the resist film 41 in regions in which gate electrodes are to be formed. By etching using the patterned resist film 41 as a mask, a control gate electrode (third gate electrode) 42, a gate electrode (second gate electrode) 43, a gate electrode (second gate electrode) 44 and a gate electrode 45 are formed, as illustrated in FIG. 14(a).

Among them, the gate electrodes 43 and 44 have the shortest gate length, while the above-described memory gate electrode 34 has the longest gate length. The gate length of the control gate electrode 42 and the gate electrode 45 are each greater than the gate length of the gate electrodes 43 and 44, but less than the gate length of the memory gate electrode 34.

A transistor capable of preventing punch-through is available by forming the memory gate electrode 34 with a relatively long gate length. At the same time, a transistor having an improved current driving capability can be obtained by forming the gate electrodes 43 and 44 with a relatively short gate length.

Figure 14A:
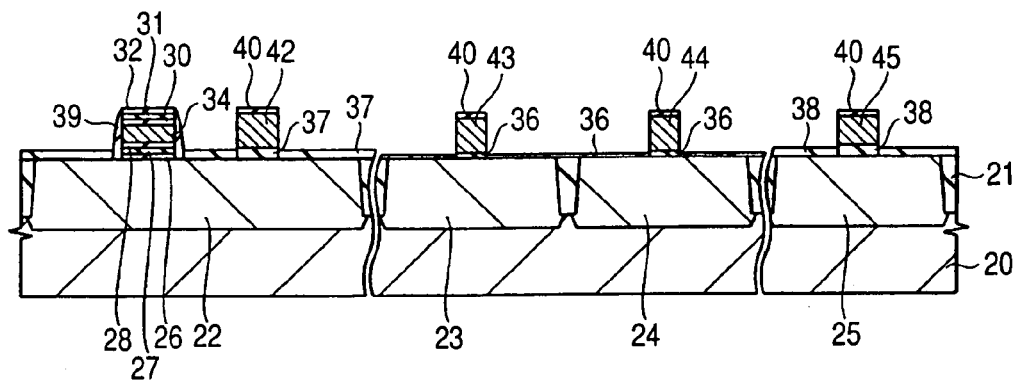
FIG. 14(a) is a cross-sectional view illustrating a step in the manufacture of the semiconductor device following the step of FIG. 13.

As illustrated in FIG. 14(a), etching does not proceed well over the sidewalls of the memory gate electrode 34, which has already been formed, and an etching residue of the polysilicon film 39 exists.

As illustrated in FIG. 14(a), the gate insulating film 36 formed in a region other than regions below the gate electrodes 43 and 44 remains in the formation regions of the MIS transistors $Q_3$ and $Q_4$ requiring a high current driving capability. In the memory cell formation region or the formation region of the high voltage MIS transistor $Q_5$, the gate insulating films 37 and 38 also remain in a region other than the regions below the control gate electrode 42 and gate electrode 45, but the thickness of these films is decreased by the etching.

Figure 14B:
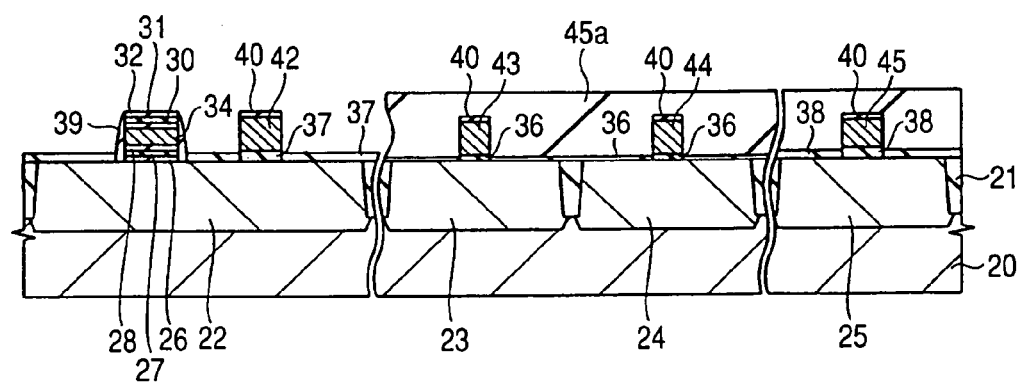
FIG. 14(b) is a cross-sectional view illustrating a manufacturing step following the step of (a)
Figure 15:
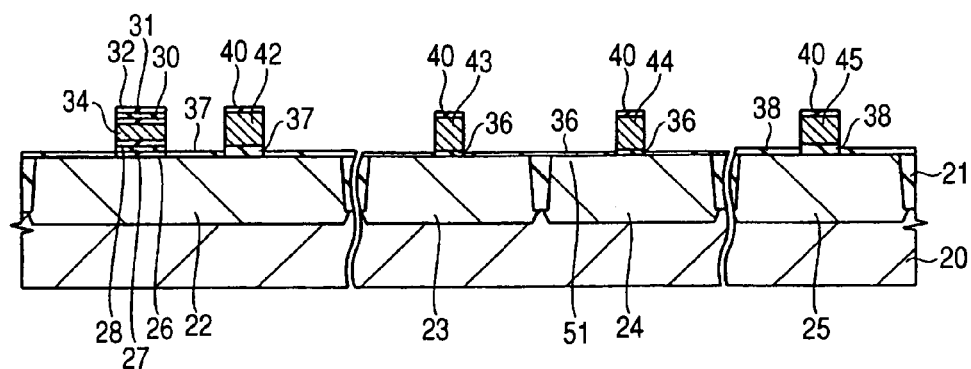
FIG. 15 is a cross-sectional view illustrating a manufacturing step following the step of FIG. 14(b)

As illustrated in FIG. 14(b), after the formation regions of the MIS transistors $Q_3$, $Q_4$ and $Q_5$ are covered with a resist film 45a, etching is conducted again in order to remove the etching residue formed over the sidewalls of the memory gate electrode 34; and, as illustrated in FIG. 15, the polysilicon film 39, which is present as an etching residue, is removed. Upon this etching, because the gate insulating film 37 remains in a region other than the region below the control gate electrode 42 in the memory cell formation region, etching of the underlying semiconductor substrate 20 can be avoided. In other words, the remaining gate insulating film 37 has a function of inhibiting over-etching of the semiconductor substrate 20 and thereby preventing a deterioration in the flatness of the semiconductor substrate 20. By forming the gate insulating film 37 with a relatively large thickness compared with the thickness of the gate insulating film 36, it has enhanced dielectric breakdown, and at the same time, can function as a protecting film during the manufacturing steps.

Figure 16:
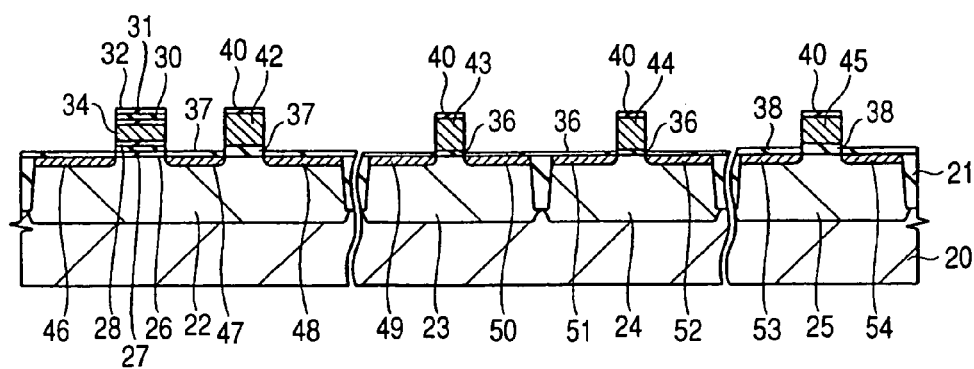
FIG. 16 is a cross-sectional view illustrating a manufacturing step following the step of FIG. 15.

As illustrated in FIG. 16, low-concentration n-type-impurity diffusion regions 46 to 50, 53 and 54 are formed by photolithography and ion implantation. The low-concentration n-type-impurity diffusion regions 46 to 50, 53 and 54 can be formed by introducing an n type impurity, such as phosphorus or arsenic, into the semiconductor substrate 20 and then carrying out heat treatment for activating the n type impurity thus introduced. In a similar manner, low-concentration p-type-impurity diffusion regions 51 and 52 are formed.

Figure 17:
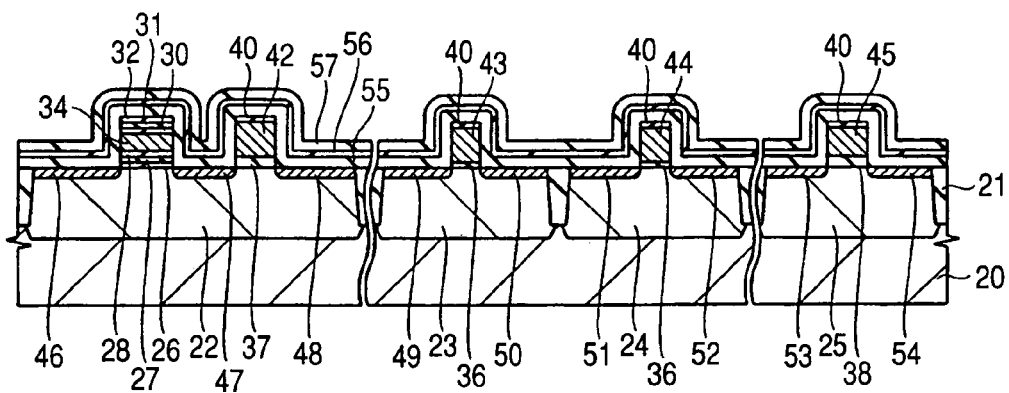
FIG. 17 is a cross-sectional view illustrating a manufacturing step following the step of FIG. 16.

As illustrated in FIG. 17, a silicon oxide film (first insulating film) 55, for example, is then formed as an insulating film over the entire main surface of the semiconductor substrate 20. In other words, the silicon oxide film 55 is formed over the memory cell formation region (formation regions of MONOS transistor $Q_1$ and MIS transistor $Q_2$), formation regions of the low voltage MIS transistors $Q_3$ and $Q_4$ and the formation region of the high voltage MIS transistor $Q_5$.

The silicon oxide film 55 can be formed, for example, by CVD, and its film thickness is, for example, about 150 nm.

A silicon nitride film (second insulating film) 56, for example, is then formed as an insulating film over the silicon oxide film 55. The silicon nitride film 56 can be formed, for example, by CVD, and its thickness is, for example, about 30 nm.

Over the silicon nitride film 56, a silicon oxide film (third insulating film) 57, for example, is formed as an insulating film. The silicon oxide film can be formed in a similar manner to that employed for the formation of the silicon oxide film 55, for example, by CVD. The thickness of the silicon oxide film 57 is, for example, 100 nm. In the above-described manner, a film stack consisting of the silicon oxide film 55, the silicon nitride film 56 and the silicon oxide film 57 is formed over the entire main surface of the semiconductor substrate 20. The silicon nitride film 56, which is a second layer of this film stack, has, as can be understood from the above description, the smallest thickness of all of the three layers.

The silicon oxide film 55 is formed with a greater thickness than that of the gate insulating film 26 of the MONOS transistor $Q_1$. For the writing operation of EEPROM 5, a method of injecting electrons (or holes) into the charge storage film 27 of the MONOS transistor $Q_1$ by making use of injection of hot electrons or the Fowler-Nordheim tunneling phenomenon is adopted, so that the silicon oxide film 55 formed with a larger thickness can prevent electrons (or holes) from being injected into the silicon nitride film 56 of the sidewall spacers A. The silicon oxide film 55 is thus formed as a non-charge storage film.

Figure 18:
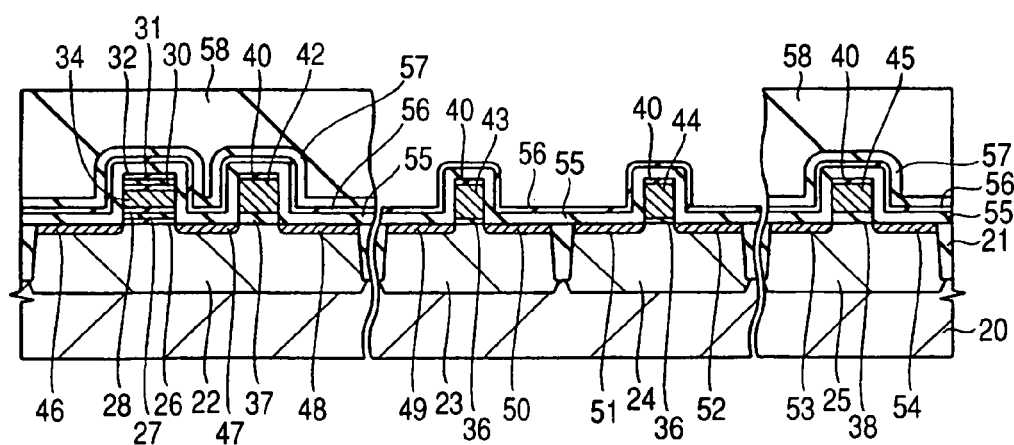
FIG. 18 is a cross-sectional view illustrating a manufacturing step following the step of FIG. 17.

As illustrated in FIG. 18, a resist film 58 is applied onto the silicon oxide film 57, followed by patterning by exposure and development. This patterning is conducted to make openings only in the formation regions of the low voltage MIS transistors $Q_3$ and $Q_4$. In other words, the patterning is conducted to leave the resist film 58 in the memory cell formation region and the formation region of the high voltage MIS transistor $Q_5$.

Using the patterned resist film 58 as a mask, wet etching of the silicon oxide film 57 is conducted (first etching step). By this wet etching, the silicon oxide film 57 deposited in the formation regions of the MIS transistors $Q_3$ and $Q_4$ is removed. In other words, the unnecessary silicon oxide film 57 formed to cover the gate electrodes 43 and 44 is removed without removing the silicon oxide film 57 formed to cover the memory gate electrode 34 and control gate electrode 42.

Below the silicon oxide film 57, a silicon nitride film 56 is formed. This silicon nitride film 56 functions as a stopper film during wet etching. Instead of the silicon nitride film 56, another stopper film may be formed for wet etching of the silicon oxide film 57. No particular limitation is imposed on the kind of the stopper film so long as the etching selectivity is sufficient. It is necessary to determine the thickness of the stopper film for wet etching in consideration of the selectivity upon wet etching.

In the first etching step, the insulating film (silicon oxide film 57) in the regions of the low voltage MIS transistors $Q_3$ and $Q_4$ is removed by etching. In this step, the widths of the sidewall spacers C and D must be narrowed so that isotropic etching, such as wet etching, is conducted to completely remove the insulating film (silicon oxide film 57) over the insulating film (silicon nitride film 56).

The gate insulating films 36, 37 and 38 are not illustrated in the drawings on and after FIG. 17 for the sake of simplicity, except for those formed below the memory gate electrode 34 and gate electrodes 42, 43, 44 and 45.

Figure 19:
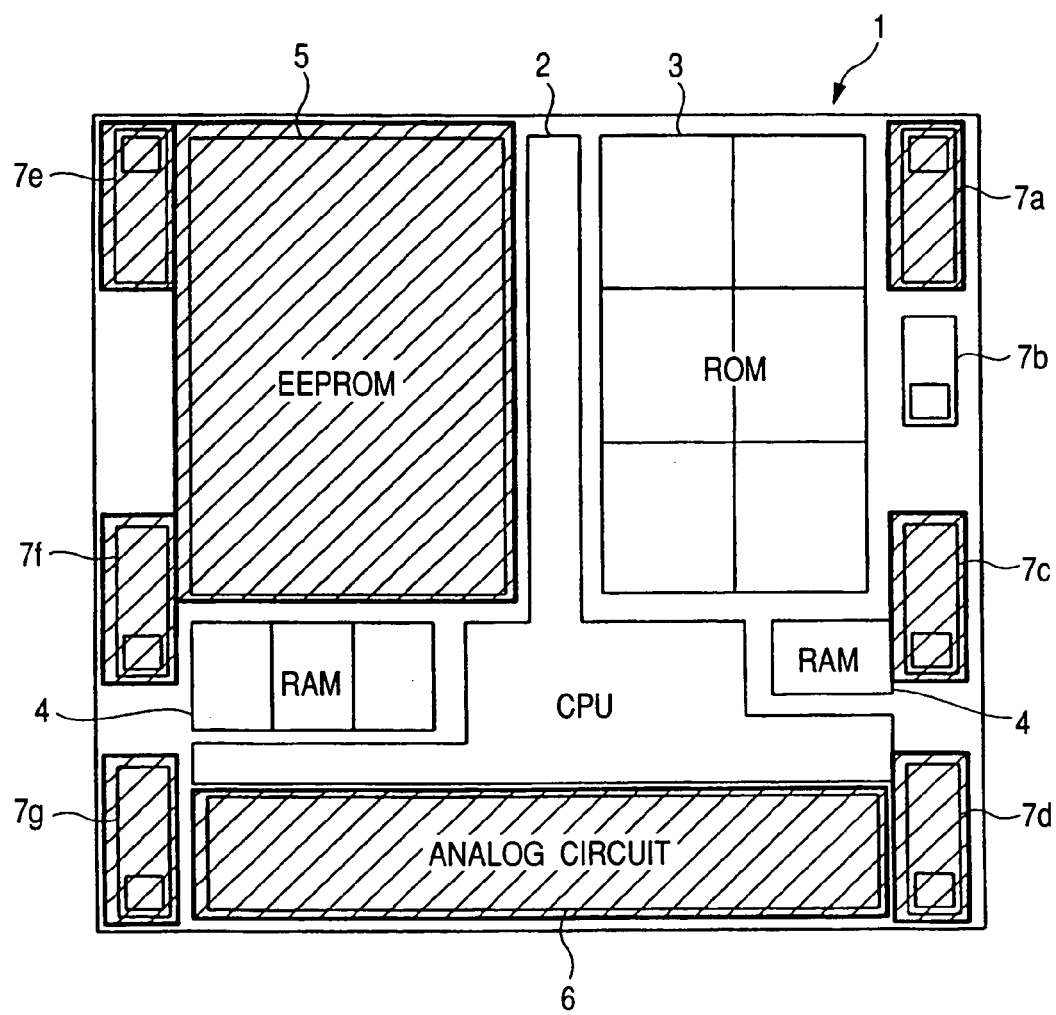
FIG. 19 is a top plan view which illustrates a patterned resist film formed over a semiconductor chip.

FIG. 19 illustrates each of the regions to be covered with the resist film 58. In FIG. 19, the regions to be covered with the resist film 58 are the EEPROM 5, a formation region of the analog circuit 6, and formation regions of electrostatic protection circuits 7a, and 7c to 7g. In these regions, transistors requiring enhancement of the high breakdown voltage are formed. To facilitate an understanding, the regions covered with the resist film 58 are hatched. This hatching does not indicate their cross-sections.

Figure 20:
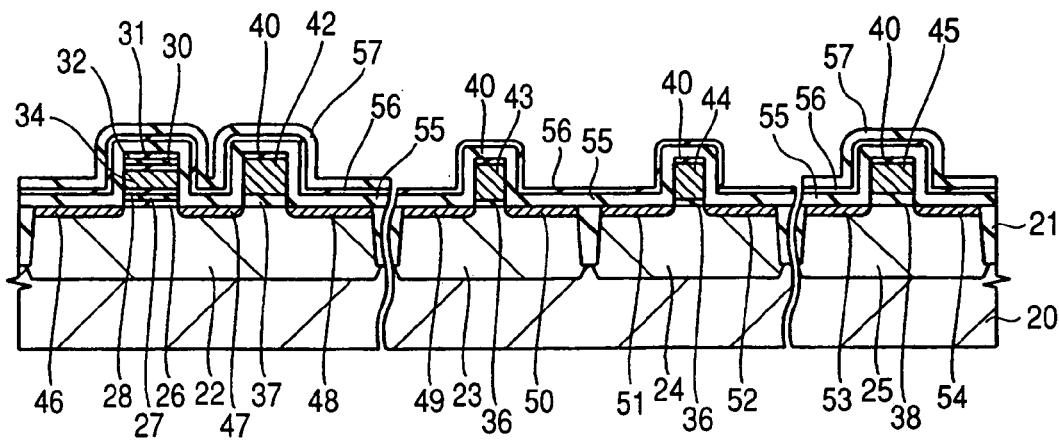
FIG. 20 is a cross-sectional view illustrating a manufacturing step following the step of FIG. 18.

As illustrated in FIG. 20, the resist film 58 which has covered the memory cell formation region and the formation region of the high voltage MIS transistor $Q_5$ is removed. In this manner, a three-layer stack film consisting of the silicon oxide film 55, silicon nitride film 56 and silicon oxide film 57 can be formed in a region once covered with the resist film, while in a region not covered with the resist film 58, a two-layer film stack consisting of the silicon oxide film 55 and silicon nitride film 56 can be formed.

Figure 21:
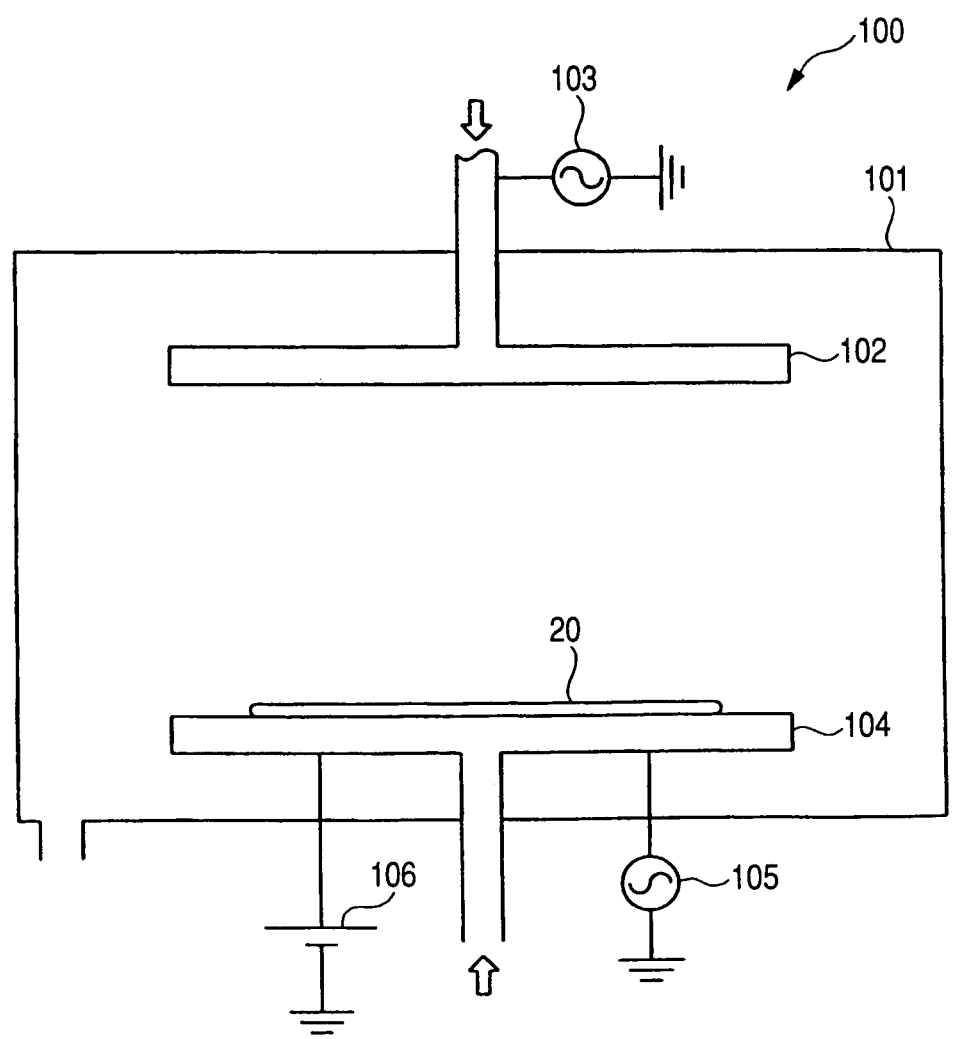
FIG. 21 is a schematic diagram illustrating the structure of a dry etching apparatus.

The semiconductor substrate 20 having such film stacks formed thereover is then transferred into a dry etching apparatus, as illustrated in FIG. 21, for anisotropic dry etching.

FIG. 21 is a diagram illustrating the constitution of the dry etching apparatus 100. As seen in FIG. 21, the dry etching apparatus 100 has a chamber 101, upper electrode 102, high-frequency power source 103, lower electrode 104, high-frequency power source 105 and DC power source 106.

The chamber 101 is an enclosed chamber for the etching of a film formed over the semiconductor substrate 20, and it has the upper electrode 102 and lower electrode 104 inside thereof. The chamber 101 has an exhaust port for discharging a gas emitted by the reaction.

The upper electrode 102 functions as a feed port for introducing a raw material gas for anisotropic dry etching into the chamber 101. To the upper electrode 102, the high frequency power source 103 is attached. This high frequency power source 103 has a function of converting the raw material gas introduced from the upper electrode 102 into plasma, that is, a function of converting the raw material gas into ions or radicals.

The lower electrode 104 has a structure permitting disposal of the semiconductor substrate 20 thereover and introduction of an inactive gas (such as helium gas) into the semiconductor substrate 20 from the bottom portion. Since the temperature inside of the chamber 101 becomes high during emission of plasma, a helium gas is introduced in order to keep good thermal conduction between the lower electrode 104 and the semiconductor substrate 20, even if a space exists between the semiconductor substrate 20 and the lower electrode 104 owing to a slight warping of the semiconductor substrate 20. In other words, heat conduction to the semiconductor substrate 20 does not proceed smoothly in almost a vacuum condition in the chamber 101, so that thermal contact between the lower electrode 104 and the semiconductor substrate 20 is improved by the introduction of a helium gas. By introducing a helium gas, the semiconductor substrate 20 can be cooled and freed from any bowing, whereby the contact area between the semiconductor substrate 20 and the lower electrode 104 can be made as uniform as possible.

To the lower electrode 104, the high frequency power supply 105 and DC power source 106 are connected. The high frequency power supply 105 is installed in order to attract ions or radicals to the semiconductor substrate 20, while the DC power supply 106 is installed in order to prevent the semiconductor substrate 20 from being separated from the lower electrode 104 owing to static electricity produced in the chamber 101 and thereby to cause the semiconductor substrate 20 to adhere to the lower electrode 104.

In the dry etching apparatus 100 having such a structure, the semiconductor substrate 20 having a film formed thereover as illustrated in FIG. 20 is placed on the lower electrode 104. Then, a raw material gas mixture of $C_4F_8$, $O_2$ and Ar in plasma form is introduced from the upper electrode 102 into the chamber 101. By means of the ions or radicals introduced in the chamber 101, the film formed over the semiconductor substrate 20 is subjected to anisotropic dry etching. Etching by the ions proceeds mainly by their collision with the film, while etching by the radicals proceeds by their-chemical reaction with the film.

Figure 22:
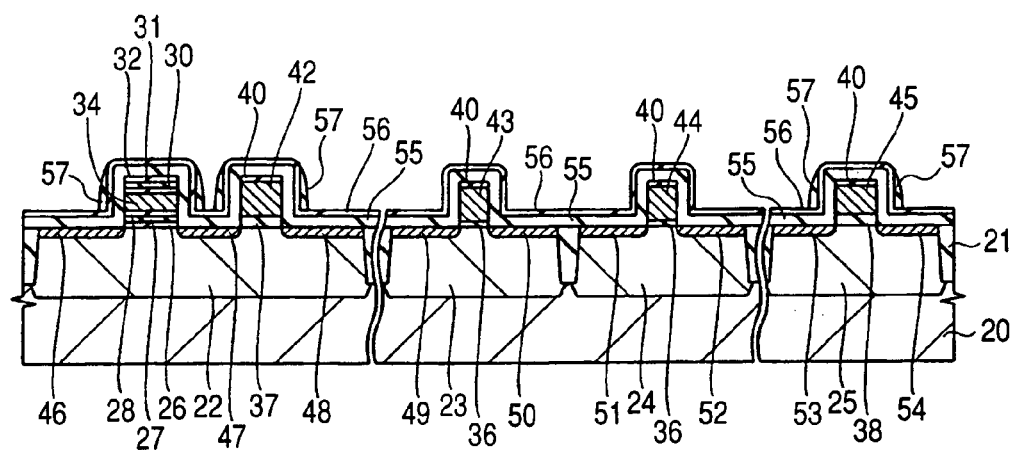
FIG. 22 is a cross-sectional view illustrating a manufacturing step following the step of FIG. 20.

By the anisotropic dry etching with $C_4F_8$, $O_2$ and Ar as raw material gases, a silicon oxide film is mainly etched and a silicon nitride film is scarcely etched. In other words, anisotropic etching proceeds at a predetermined etching selectivity (first etching selectivity) at which the etching rate of the silicon nitride film is smaller than that of the silicon oxide film. As illustrated in FIG. 22, the silicon oxide film 57 deposited in the memory cell formation region and the formation region of the high voltage MIS transistor $Q_5$ is etched (second etching step). The etching method adopted here is anisotropic dry etching, so that, as illustrated in FIG. 22, the silicon oxide film 57 remains over the sidewalls of the memory gate electrode 34, control gate electrode 42 and gate electrode 45.

The sidewall spacers A, B and E in the regions of the MONOS transistor $Q_1$ and high voltage MIS transistors $Q_2$ and $Q_5$ must be formed with a large thickness in this etching step so that anisotropic etching is used to remove the silicon oxide film 57, while leaving the silicon oxide film 57 over the sidewalls of the memory gate electrode 34, control gate electrode 42 and the gate electrode 45.

Figure 23:
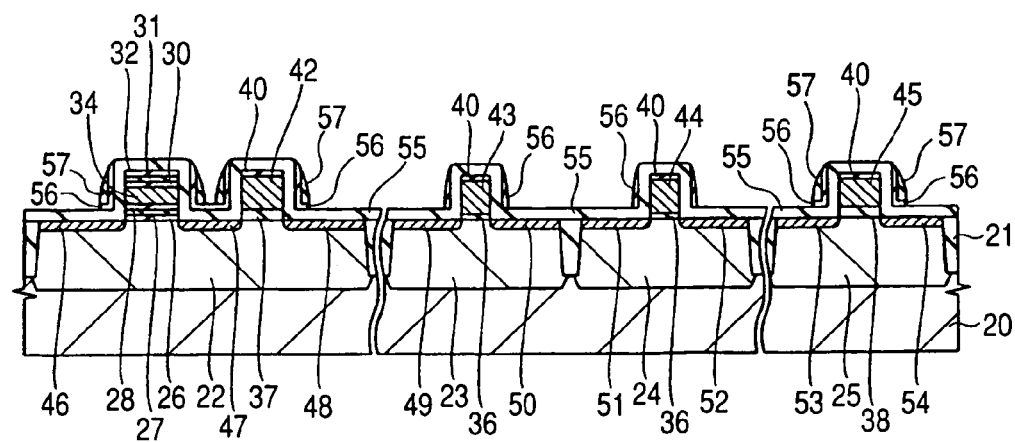
FIG. 23 is a cross-sectional view illustrating a manufacturing step following the step of FIG. 22.

At the temperature of the semiconductor substrate 20, which is set at 0° C., anisotropic dry etching is conducted with $CHF_3$, $O_2$ and Ar being used as raw material gases. By this etching, the silicon nitride film is mainly removed, but the silicon oxide film is scarcely etched (third etching step). In other words, anisotropic etching proceeds at a predetermined etching selectivity (second etching selectivity) at which the etching rate of the silicon oxide film is smaller than that of the silicon nitride film. As illustrated in FIG. 23, the silicon nitride film 56, which is exposed over the semiconductor substrate 20, is etched. The etching adopted here is anisotropic etching, so that the silicon nitride film 56 remains over the side walls of the gate electrode 43 and gate electrode 44. By this step, the silicon nitride film 56, which is exposed by the removal of the silicon oxide film 57, is removed without removing the silicon nitride film 56 formed over the sidewalls of the gate electrodes 43 and 44.

The silicon oxide film 57, which is formed over the sidewalls of the memory gate electrode 34, control gate electrode 42, and the gate electrode 45, protects the silicon nitride film 56, which has been formed below this silicon oxide film 57 and is not exposed, from being removed.

Figure 24:
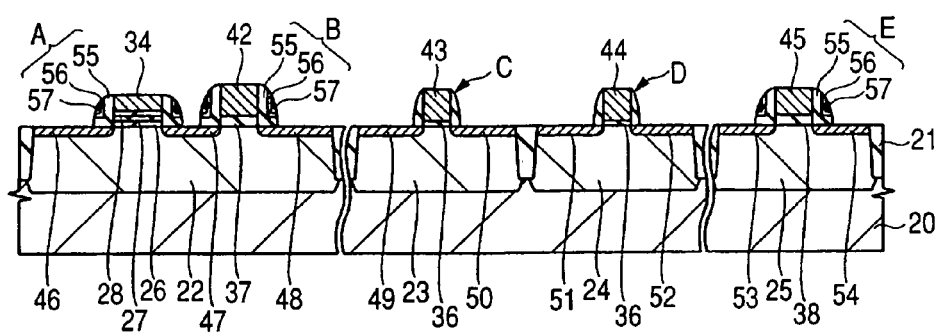
FIG. 24 is a cross-sectional view illustrating a manufacturing step following the step of FIG. 23.

While the temperature of the semiconductor substrate 20 is set at 0° C., anisotropic dry etching (fourth etching step) is conducted with $CF_4$, $CHF_3$ and Ar being used as raw material gases. Upon etching of the insulating film (silicon oxide film 55), the remaining insulating film (silicon nitride film 56) must be removed by etching. In the fourth etching step, etching is conducted under the conditions where a difference in the etching selectivity between the silicon oxide film 55 and the silicon nitride film 56 is smaller than that in the second etching step. The etching in the fourth etching step can also be conducted under conditions where there is no difference in the etching selectivity between the silicon oxide film 55 and the silicon nitride film 56. In the latter case, anisotropic etching proceeds while the etching rate of the silicon oxide film and that of the silicon nitride film are substantially equal. By this step, it is therefore possible to remove the silicon nitride film formed over the sidewalls of the gate electrodes 43 and 44 and, at the same time, to remove the silicon oxide film 55, while leaving the silicon oxide film 55 over the sidewalls of the memory gate electrode 34, control gate electrode 42 and gate electrodes 43 to 45. As illustrated in FIG. 24, sidewall spacers A, sidewall spacers B, sidewall spacers C, sidewall spacers D and sidewall spacers E are formed over the sidewalls of the memory gate electrode 34, those of the control gate electrode 42, those of the gate electrode 43, those of the gate electrode 44 and those of the gate electrode 45, respectively.

The sidewall spacers A, B and E are constituted by the silicon oxide film 55, silicon nitride film 56 and silicon oxide film 57, while the sidewall spacers C and D are made of the silicon oxide film 55. Accordingly, the sidewall spacers A, B and E can each be formed with a relatively greater width than the sidewall spacers C and D. The final width of the sidewall spacers A to E can thus be determined by controlling the thickness of the film deposited prior to the three dry etching steps (second to fourth etching steps).

In this step, etching is conducted with almost no difference in the etching rate between the silicon oxide film and silicon nitride film. Alternatively, etching may be conducted at a predetermined etching selectivity at which etching rates differ between these films. Etching selectivities in the above-described three etching steps are, for example, different from each other and an optimum value can be adopted for each etching step.

In the above-described example, the silicon oxide film 55, the silicon nitride film 56 and the silicon oxide film 57 were employed as the first, second and third layer insulating films, respectively. The insulating films are not particularly limited to this example, but it can be used insofar as the first-layer insulating film and the second-layer insulating film have different etching rates, and the second-layer insulating film and the third-layer insulating film have different etching rates; or the first-layer insulating film, the second-layer insulating film and the third-layer insulating film have different etching rates. For example, it is possible to use a silicon nitride film for the formation of the first-layer and third-layer insulating films and a silicon oxide film for the formation of the second-layer insulating film. Instead of the silicon oxide film or silicon nitride film, a silicon oxynitride film may be used for the formation. It is also possible to form at least one of the first-layer and third-layer insulating films from a silicon oxynitride film, or to form the second-layer insulating film from a silicon oxynitride film.

The sidewall spacers A formed over the sidewalls of the MONOS transistor $Q_1$ are, as described above, made of the silicon oxide film 55, silicon nitride film 56 and silicon oxide film 57. The reason for inserting the silicon oxide film 55 between the silicon nitride film 56 and each of the semiconductor substrate 20, charge storage film 27 and memory gate electrode 34 will be described next. In the MONOS transistor $Q_1$, a writing operation is conducted by injecting charges from the semiconductor substrate 20 into the charge storage film 27. When the silicon nitride film 56 is directly contiguous to the semiconductor substrate 20, electrons or holes are inevitably injected into not only the charge storage film 27, but also the silicon nitride film 56, which is to constitute the sidewall spacers, upon data writing. This presumably introduces errors in the MONOS transistor $Q_1$, which leads to deterioration in the reliability. In order to avoid direct contact of the silicon nitride film 56 with the semiconductor substrate 20, the memory gate electrode 34 and the charge storage film 27, the silicon oxide film 55 is disposed as a non-charge storage film, which does not accumulate charges therein. At this time, the silicon oxide film 55 constituting the sidewall spacers A is formed to have a thickness that is larger than that of the gate insulating film 26 of the MONOS transistor $Q_1$. In a writing operation of the EEPROM 5, electrons (or holes) are injected into the charge storage film 27 of the MONOS transistor $Q_1$ by making use of hot electron injection or the Fowler-Nordheim tunneling phenomenon, so the formation of the silicon oxide film 55 with a larger film thickness can prevent injection of electrons (or holes) into the silicon nitride film 56 of the sidewalls A. In short, the silicon oxide film 55 is formed to have a thickness sufficient to prevent the injection of electrons (or holes) into the silicon nitride film 56 in a writing operation of the EEPROM 5. This makes it possible to prevent errors of the MONOS transistor $Q_1$ and, thereby, to improve the reliability of the semiconductor device.

Figure 25:
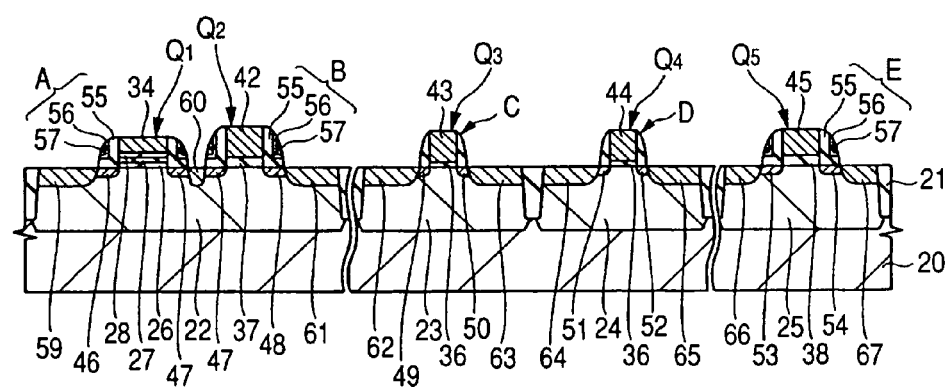
FIG. 25 is a cross-sectional view illustrating a manufacturing step following the step of FIG. 24.

As illustrated in FIG. 25, high-concentration n-type-impurity diffusion regions 59 to 63, 66 and 67 are formed in the semiconductor substrate 20 by using photolithography and ion implantation. These high-concentration n-type-impurity diffusion regions 59 to 63, 66 and 67 can be formed, for example, by introducing an n type impurity, such as phosphorus or arsenic, into the semiconductor substrate 20, followed by heat treatment for activating the n type impurity thus introduced. In a similar manner, high-concentration p-type-impurity diffusion regions 64 and 65 can be formed.

In the above-described manner, the MONOS transistor $Q_1$ and MIS transistors $Q_2$ to $Q_5$ can be fabricated.

Over the entire main surface of the semiconductor substrate 20, a cobalt film, for example, is then formed as a refractory metal film. The cobalt film can be formed, for example, by sputtering or CVD. By use of heat treatment, a cobalt silicide film 68 is formed over the memory gate electrode 34, control gate electrode 42, gate electrodes 43 to 45, high-concentration n-type-impurity diffusion regions 59 to 63, 66 and 67, and high-concentration p-type-impurity diffusion regions 64 and 65, as illustrated in FIG. 3. This cobalt silicide film 68 is formed for the purpose of lowering the resistance. The cobalt silicide film 68 can be formed over the memory gate electrode 34, control gate electrode 42, gate electrodes 43 to 45, high-concentration n-type-impurity diffusion regions 59 to 63, 66 and 67, and high-concentration p-type-impurity diffusion regions 64 and 65 by depositing a cobalt film, heat treating the film and then removing an unreacted portion of the cobalt film. As the refractory metal film, a titanium film or nickel film is used instead of the cobalt film, whereby a titanium silicide film or nickel silicide film can be formed.

As illustrated in FIG. 3, a silicon nitride film 69 is formed over the main surface of the semiconductor substrate 20. The silicon nitride film 69 can be formed, for example, by CVD.

Over the silicon nitride film 69, a silicon oxide film 70 is formed. This silicon oxide film 70 can also be formed, for example, by CVD. Then, the surface of the silicon oxide film 70 is planarized, for example, by CMP (Chemical Mechanical Processing).

By photolithography and etching, contact holes 71 are made in the silicon oxide film 70. Over the silicon oxide film 70, including the bottom surface and inside walls of the contact holes 71, a titanium/titanium nitride film 72a is formed. This titanium/titanium nitride film 72a is made of a film stack constituted of a titanium film and a titanium nitride film, and it can be formed, for example, by sputtering. The titanium/titanium nitride film 72a has a function of preventing tungsten, which is the material of a film to be embedded in the later step, from diffusing into silicon, that is, has a so-called barrier property.

Then, a tungsten film 72b is formed over the entire main surface of the semiconductor substrate 20 so that it is embedded in the contact holes 71. This tungsten film 72b can be formed, for example, by CVD. Unnecessary portions of the titanium/titanium nitride film 72a and tungsten film 72b formed over the silicon oxide film 70 are then removed by CMP to form plugs 72.

Over the silicon oxide film 70 and plugs 72, a titanium/titanium nitride film 73a, an aluminum film 73b and a titanium/titanium nitride film 73c are formed successively. These films can be formed, for example, by sputtering. They are then patterned by photolithography and etching to form an interconnect 73. Another interconnect is formed over the interconnect 73, but description thereof is omitted here.

In the above-described manner, it is possible to form the MONOS transistor $Q_1$ and MIS transistors $Q_2$ and $Q_5$, each having relatively wide sidewalls, such as sidewall spacers A, B and E, and the MIS transistors $Q_3$ and $Q_4$, each having relatively narrow sidewall spacers, such as sidewall spacers C and D over one chip 1. In other words, the MONOS transistor $Q_1$ and MIS transistors $Q_2$ and $Q_5$, each having enhanced breakdown voltage of pn junction between the source region and the semiconductor substrate 20, and between the drain region and the semiconductor substrate 20 by relatively widening the width of each of the sidewall spacers A, B and E, can be formed while forming the MIS transistors $Q_3$ and $Q_4$ having an improved current driving capability by relatively narrowing the width of each of the sidewall spacers C and D.

The manufacturing method for fabrication of the semiconductor device according to Embodiment 1 makes it possible to form field effect transistors that are different in the width of the sidewall spacers over the chip 1 by using only one more mask compared with the formation of field effect transistors having sidewall spacers of the same width. As illustrated in FIG. 18, the method of manufacture of the semiconductor device according to Embodiment 1 has a step of masking the memory cell formation region and the formation region of the high voltage MIS transistor $Q_5$ with the resist film 58 and then removing, by wet etching, the silicon oxide film 57 deposited over the formation regions of the MIS transistors $Q_3$ and $Q_4$ requiring a current driving capability. So the number of masks used in this method increases by one. However, masks are not used in the subsequent three dry etching steps. By simple steps using one more mask, field effect transistors which are different in the width of the sidewall spacers can be formed. By the manufacturing method for the semiconductor device according to Embodiment 1, therefore, electric field transistors having improved electrical properties can be manufactured in simplified steps.

The semiconductor device of this Embodiment 1 can be manufactured by simplified steps so that a reduction in the yield of products can be suppressed.

Since the manufacturing method for the semiconductor device of Embodiment 1 includes no complex steps, products manufactured thereby have fewer variations in the electrical properties, such as the breakdown voltage of the pn junction and the current driving capability.

Embodiment 2

In Embodiment 2, a method different from that of Embodiment 1 is employed for the formation of field effect transistors which are different in the width of the sidewall spacers. The method will be described next.

Figure 26:
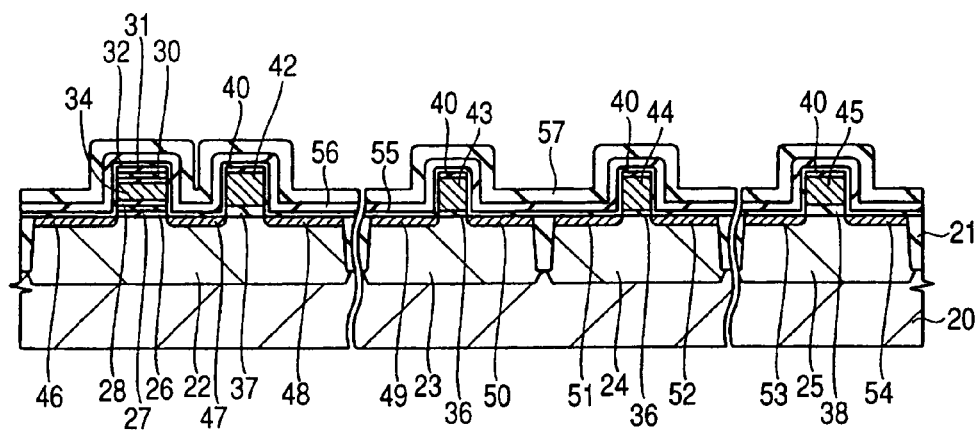
FIG. 26 is a cross-sectional view illustrating a step in the manufacture of a semiconductor device according to Embodiment 2 of the present invention.

Steps illustrated in FIG. 7 to FIG. 16 are similarly employed in this Embodiment. As illustrated in FIG. 26, a silicon oxide film 55, a silicon nitride film 56 and a silicon oxide film 57 are deposited successively over the element formation surface of the semiconductor substrate 20. By this step, the silicon oxide film 55, silicon nitride film 56 and silicon oxide film 57 are formed to cover the memory gate electrode 34, control gate electrode 42 and gate electrodes 43 to 45.

For the formation of the silicon oxide film 55, silicon nitride film 56 and silicon oxide film 57, a method capable of forming a uniform film free from the influence of the step difference of the underlying film at a temperature as low as possible is desirable. The reason for forming a uniform film free of the influence of a step difference of an underlying film is because the occurrence of variations, for example, in the width of the sidewall spacers formed over the sidewalls of the memory gate electrode 34 must be prevented.

The reason for setting the temperature for the formation of these films as low as possible is because a deterioration in the electrical properties of the field effect transistors must be prevented. In general, simulation of the profile of impurity diffusion regions, which will constitute source regions, and drain regions is made in the design stage; and, based on the simulation results, the conditions of ion implantation and heat treatment are determined. When a new step is added to the manufacturing steps of field effect transistors as in this Embodiment 2, however, this additional step, if it includes high temperature treatment, will be a cause for ruining the profile of the impurity diffusion regions, leading to a deterioration in the electrical properties of field effect transistors. It is therefore necessary to form films at a low temperature.

For such reasons, the silicon oxide film 55, silicon nitride film 56 and silicon oxide film 57 are therefore formed by low-pressure CVD, which is a method that is capable of forming a film at a relatively low temperature. More specifically, the silicon oxide film 55 and silicon oxide film 57 are formed by low pressure CVD at about 640° C., while the silicon nitride film 56 is formed by low pressure CVD at about 700° C., which is lower than the ordinary employed temperature of 780° C. According to the manufacturing process used for fabrication of the semiconductor device of Embodiment 2, a deterioration in electrical properties of the field effect transistor can be suppressed.

The silicon oxide film 55 which is deposited in this step is, for example, about 10 nm thick. The silicon oxide film 55 having such a film thickness is formed for the following reasons. First, the silicon nitride film 56, which is formed over the silicon oxide film 55, will be etched back in a step which will be described later, and during this etch back process, a film serving as an etching stopper becomes necessary. In other words, etching of the semiconductor substrate 20 is prevented by the formation of the silicon oxide film 55, which serves as an etching stopper.

The second reason is that, when the silicon nitride film 56 is brought in direct contact with the semiconductor substrate 20, the memory gate electrode 34 and the charge storage film 27, electrons or holes are injected into the silicon nitride film 56, which will be used for the sidewall spacers. In the MONOS transistor $Q_1$, a writing operation is carried out, for example, by injecting charges from the semiconductor substrate 20 into the charge storage film 27. When the silicon nitride film 56 is in direct contact with the semiconductor substrate 20, electrons or holes are inevitably injected into not only the charge storage film 27, but also the silicon nitride film 56, which will serve as sidewall spacers, during a writing operation. This causes errors of the MONOS transistor $Q_1$, leading to a deterioration in the reliability thereof. To avoid direct contact of the silicon nitride film 56 with the semiconductor substrate 20, the memory gate electrode 34 and the charge storage film 27, the silicon oxide film 55 is formed as a non-charge storage film, which does not store charges therein. If this silicon oxide film 55 does not have a sufficient thickness, however, electrons or holes are injected into the silicon nitride film 56 that is formed over the silicon oxide film 55 by a tunnel current. The thickness of the silicon oxide film 55 is therefore adjusted to be about 10 nm, which is a thickness not permitting the passage of a tunnel current. The silicon oxide film 55, which will serve as sidewall spacers, is formed with a larger width than that of the gate insulating film 26 of the MONOS transistor $Q_1$. In other words, its thickness is adjusted so as to prevent injection of electrons (holes) into the silicon nitride film 56 during a writing operation of the EEPROM 5. This makes it possible to prevent errors of the MONOS transistor $Q_1$ and thereby improve the reliability of the semiconductor device.

The thickness of the silicon nitride film 56 that is formed over the silicon oxide film 55 is about 100 nm, and it is greater the thickness (about 30 nm) of the silicon nitride film 56 in Embodiment 1. The film thickness is increased for the following reason. When the silicon nitride film has a thickness as described in connection with Embodiment 1, sidewall spacers that are formed, for example, over the memory gate electrode 34 are recessed, making it difficult to process the sidewalls. In Embodiment 1, the silicon oxide film 57 that is formed over the silicon nitride film 56 is removed by dry etching in the formation region of the MONOS transistor $Q_1$. As a result of examination by the present inventors, it has been found that, in the shoulder portion (upper part of the sidewall) of the memory gate electrode 34, for example, there is a potential danger of the selectivity to the silicon oxide film 57 over the silicon nitride film 56 upon dry etching becoming much lower than the expected selectivity. The following is a description of the examination made by the present inventors.

As described in connection with Embodiment 1, when the silicon nitride film 56 is made thinner than the silicon oxide films 55 and 57, not only the silicon oxide film 57, but also the underlying silicon nitride film 56, are etched at a shoulder portion of the memory gate electrode 34. Owing to the lack of a portion of the silicon nitride film 56, there is a possibility that the silicon oxide film 55 lying below the silicon nitride film 56 may be etched. At the bottom portion (flat portion) of the sidewalls of the memory gate electrode 34, on the other hand, a sufficient selectivity to the silicon oxide film 57 over the silicon nitride film 56 can be secured. Accordingly, it has been found that there is a possibility that the sidewalls have a concave shape from the upper part toward the middle part of the sidewalls of the memory gate electrode 34, and that they protrude like a horn at the bottom portion of the sidewalls of the memory gate electrode 34. This presumably prevents smooth processing of the sidewall spacers. In order to prevent a lack of the silicon nitride film 56 from the shoulder portion of the memory gate electrode 34, the silicon nitride film 56 is formed with a great thickness in this Embodiment 2.

The thickness of the silicon oxide film 57 that is formed over the silicon nitride film 56 is, for example, 160 nm, which is thicker than the silicon oxide film 55 and silicon nitride film 56. The width of the sidewall spacers depends on the thickness of the silicon oxide film 57 that is formed as the top layer film, so that the top silicon oxide film 57 has a sufficient thickness to permit formation of sidewall spacers with a desired width.

Figure 27:
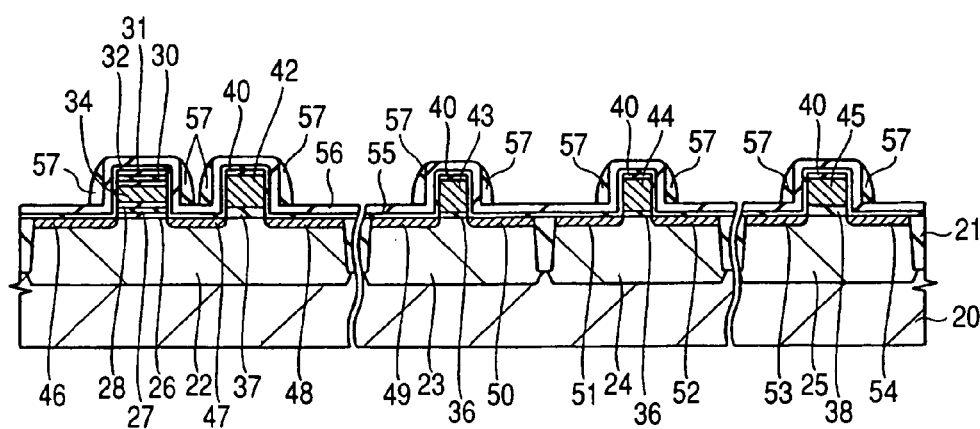
FIG. 27 is a cross-sectional view illustrating a manufacturing step following the step of FIG. 26.

After the formation of the silicon oxide film 55, silicon nitride film 56 and silicon oxide film 57 with predetermined thicknesses, the silicon oxide film 57 that is formed as a top layer film is etched, as illustrated in FIG. 27. The etching employed in this step is anisotropic dry etching so that the silicon oxide film 57 remains on the sidewalls of the memory gate electrode 34, control gate electrode and gate electrodes 43 to 45, as illustrated in FIG. 27.

Figure 28:
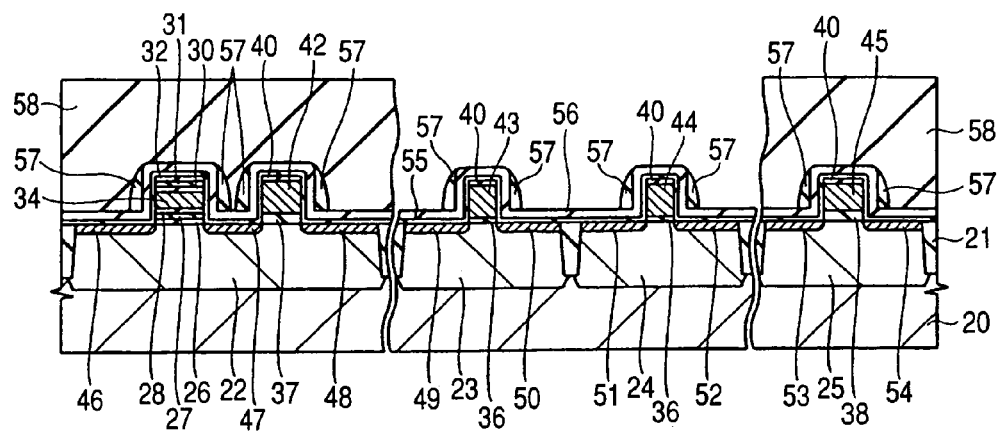
FIG. 28 is a cross-sectional view illustrating a manufacturing step following the step of FIG. 27.

As illustrated in FIG. 28, a resist film 58 is then applied to the semiconductor substrate 20, followed by exposure and development to pattern the resist film 58. Patterning is performed to open the formation regions of the low voltage MIS transistors $Q_3$ and $Q_4$. In other words, patterning is conducted to leave the resist film 58 in the memory cell formation region and the formation region of the high voltage MIS transistor $Q_5$.

Figure 29:
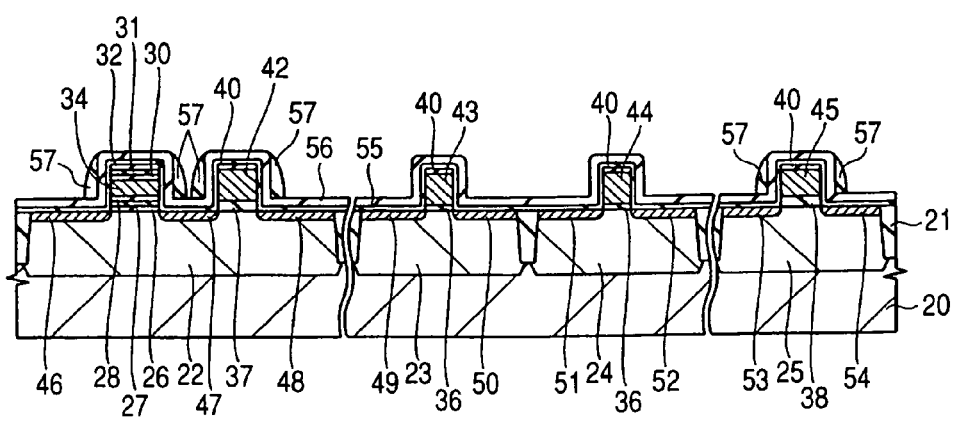
FIG. 29 is a cross-sectional view illustrating a manufacturing step following the step of FIG. 28.

As illustrated in FIG. 29, using the patterned resist film 58 as a mask, the silicon oxide film 57 remaining on the sidewalls of the gate electrode 43 and gate electrode 44 are removed. Wet etching is employed for the removal of the silicon oxide film 57. Upon wet etching, the silicon nitride film 56 serves as an etching stopper.

In this Embodiment 2, first, the silicon oxide film 57 is etched by anisotropic dry etching, followed by the removal of the silicon oxide film 57 remaining over the sidewalls of the gate electrode 43 and the gate electrode 44 by wet etching. In the formation regions of the low voltage MIS transistors $Q_3$ and $Q_4$ which have been opened, the silicon nitride film 56 is wet etched, while it is exposed in a region other than the sidewalls of the gate electrode 43 and gate electrode 44. In the exposed region of the silicon nitride film 56, penetration of an etchant into the silicon nitride film 56 must be avoided by forming the silicon nitride film 56 with a thickness greater than that of Embodiment 1.

Figure 30:
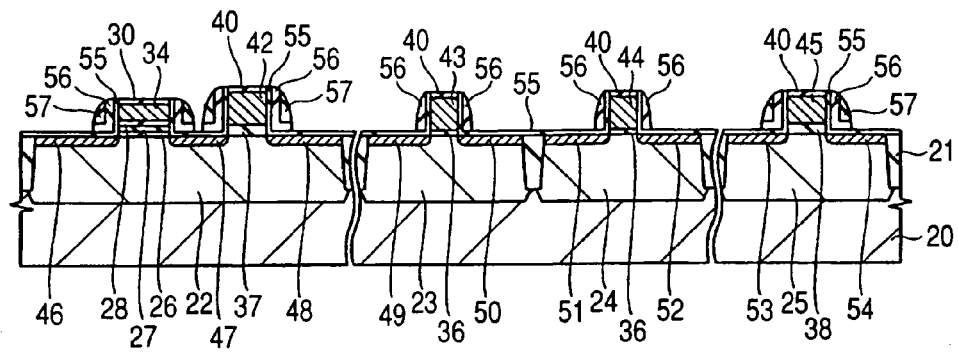
FIG. 30 is a cross-sectional view illustrating a manufacturing step following the step of FIG. 29.

As illustrated in FIG. 30, the silicon nitride film 56, which is exposed from the semiconductor substrate 20, is etched. The etching employed here is anisotropic dry etching so that the silicon nitride film 56 remains over the sidewalls of the gate electrode 43 and gate electrode 44. By this step, therefore, the silicon nitride film 56 exposed from the region other than the sidewalls of the gate electrode 43 and gate electrode 44 is removed, while leaving the silicon nitride film 56 formed over the sidewalls of the gate electrode 43 and gate electrode 44.

Since the silicon oxide film 57 is formed over the sidewalls of the memory gate electrode 34, the control gate electrode 42, and gate electrode 45, the silicon nitride film 56 formed below the silicon oxide film 57 and not exposed therefrom is not removed. Over the sidewalls of the memory gate electrode 34, control gate electrode 42 and gate electrode 45, the silicon oxide film 55, silicon nitride film 56 and silicon oxide film 57 are therefore formed. Over the sidewalls of the gate electrode 43 and gate electrode 44, only the silicon oxide film 55 and silicon nitride film 56 are formed.

Figure 31:
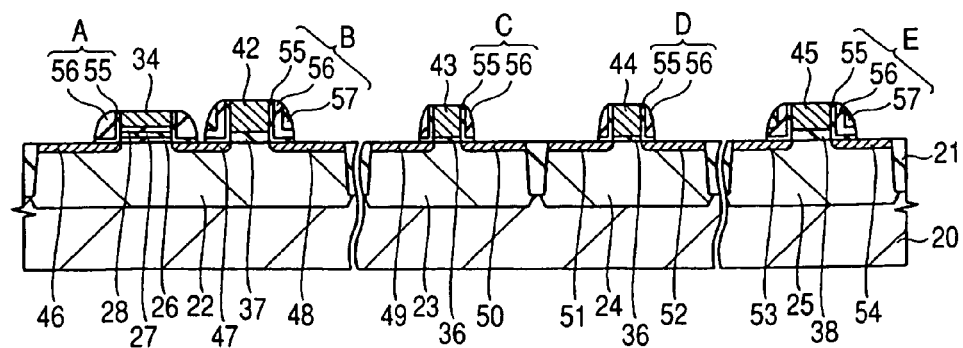
FIG. 31 is a cross-sectional view illustrating a manufacturing step following the step of FIG. 30.

As illustrated in FIG. 31, the silicon oxide film 55, which is exposed from the semiconductor substrate 20 is removed by etching. The etching employed here is anisotropic dry etching so that the silicon oxide film 55 exposed from the surface of the semiconductor substrate 20 is removed, but the silicon oxide film 57 formed over the sidewalls of the control gate electrode 42 and gate electrode 45 remains unremoved. By this anisotropic etching, however, the silicon oxide film 57 formed over the sidewalls of the memory gate electrode 34, control gate electrode 42 and gate electrode 45 is etched a little. FIG. 31 illustrates the substrate from which the silicon oxide film 57 that is formed over the sidewalls of the memory gate electrode 34 is removed by this etching. The silicon oxide film 57 sometimes remains on the sidewalls of the memory gate electrode 34, but it does not create any particular disadvantage in the electrical properties and reliability of the MONOS transistor $Q_1$, MIS transistor $Q_2$ for memory selection and high voltage MIS transistor $Q_5$.

In this manner, sidewall spacers A, sidewall spacers B, sidewall spacers C, sidewall spacers D and sidewall spacers E can be formed over the sidewalls of the memory gate electrode 34, control gate electrode 42, gate electrode 43, gate electrode 44 and gate electrode 45, respectively.

The sidewall spacers A are formed of the silicon oxide film 55 and silicon nitride film 56; the sidewall spacers B and E are each made of the silicon oxide film 55, silicon nitride film 56 and silicon oxide film 57; and sidewall spacers C and D are each formed of the silicon oxide film 55 and silicon nitride film 56. The silicon nitride film 56 of the sidewall spacers A is not etched by the etching of the silicon nitride film 56 because of the existence of the silicon oxide film 57 thereover. The silicon nitride film 56 of the sidewall spacers C and D are formed by anisotropic dry etching of the silicon nitride film 56. It is thinner than the silicon nitride film 56 of the sidewall spacers A. The width of the sidewall spacers A (width of the sidewall spacer on one side) is larger than that of the sidewall spacers B. More specifically, the width of the sidewall spacers A is, for example, about 160 nm, while that of the sidewall spacers B is, for example, 100 nm. The sidewall spacers B and E are each made of three layers, that is the silicon oxide film 55, silicon nitride film 56 and silicon oxide film 57, so that they are wider than the sidewall spacers A, C and D. They have a width of, for example, 180 nm.

The silicon oxide film 55 of the sidewall spacers A is made much thicker than the gate insulating film 26 of the MONOS transistor $Q_1$ in order to prevent writing errors in the EEPROM 5. This makes it possible to improve the reliability of the semiconductor device.

Figure 32:
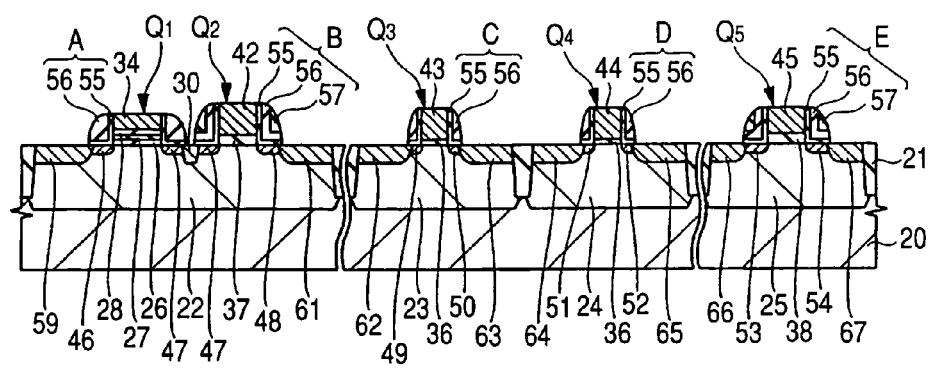
FIG. 32 is a cross-sectional view illustrating a manufacturing step following the step of FIG. 31.

As illustrated in FIG. 32, high-concentration n-type-impurity diffusion regions 59 to 63, 66 and 67 are formed in the semiconductor substrate 20 by using photolithography and ion implantation. The high-concentration n-type-impurity diffusion regions 59 to 63, 66 and 67 can be formed, for example, by introducing an n type impurity, such as phosphorus or arsenic, into the semiconductor substrate 20, and activating the n type impurity by heat treatment. Similarly, high-concentration p-type-impurity diffusion regions 64 and 65 can be formed.

In the above-described manner, the MONOS transistors $Q_1$ and MIS transistors $Q_2$ to $Q_5$, which are different in the width of sidewall spacers, can be formed. The subsequent steps are similar to those employed in Embodiment 1, so that omitted a description thereof will be.

According to Embodiment 2, the MONOS transistors $Q_1$ and MIS transistors $Q_2$ to $Q_5$ having an enhanced breakdown voltage of the pn junction between the source region and the semiconductor substrate 20, and the drain region and the semiconductor substrate 20 can be formed by relatively increasing the width of each of the sidewall spacers A, B and E, and, at the same time, the MIS transistors $Q_3$ and $Q_4$ having an improved current driving capability can be formed by relatively narrowing the width of each of the sidewall spacers C and D.

In addition, field effect transistors which are different in the width of sidewall spacers can be formed by simple steps using one more mask than the conventional steps of forming sidewalls with an equal width. Accordingly, it is possible to manufacture field effect transistors by simplified steps, while improving their electrical properties.

According to Embodiment 2, it is possible to suppress a reduction in yield of the products because a semiconductor device can be manufactured by simplified steps.

According to Embodiment 2, it is possible to reduce variations in the electrical properties of products, such as the breakdown voltage of a pn junction and the current driving capability, because complex steps are not necessary for manufacture of the product.

According to Embodiment 2, it is possible to obtain useful advantages as described below compared with Embodiment 1.

In Embodiment 1, the silicon oxide film 57 is removed from the formation regions of the low voltage MIS transistors $Q_3$ and $Q_4$ by wet etching, and then, it is removed from the memory cell formation region and formation regions of the high voltage MIS transistor $Q_5$ by anisotropic dry etching.

In Embodiment 2, on the other hand, the silicon oxide film 57, which is formed over the entire surface of the wafer, is subjected to anisotropic dry etching, followed by the removal of the silicon oxide film 57 remaining over the sidewalls of the gate electrode 43 and gate electrode 44 by wet etching. Thus, the wet etching step and dry etching step are conducted in the reverse order in Embodiment 2 as compared to Embodiment 1.

In the method of Embodiment 1, the silicon nitride film 56 is exposed from the formation regions of the low voltage MIS transistors $Q_3$ and $Q_4$ upon dry etching after wet etching. In other words, upon dry etching of the silicon oxide film 57 formed in the memory cell formation region and high voltage MIS transistor $Q_5$, the silicon nitride film 56 is exposed from the formation region of the low voltage MIS transistors $Q_3$ and $Q_4$. A high selectivity to the silicon nitride film 56 over the silicon oxide film 57 is required upon anisotropic dry etching of the silicon oxide film 57. However, it is sometimes difficult to secure a high selectivity in dry etching, and so the silicon nitride film 56 formed in the formation region of the low voltage MIS transistors $Q_3$ and $Q_4$ happens to be etched upon dry etching of the silicon oxide film 57 formed in the memory cell formation region and the formation region of the high voltage MIS transistor $Q_5$. Such a phenomenon undesirably produces a difference in the thickness between the silicon nitride film 56 formed in the memory cell formation region and formation region of the high voltage MIS transistor $Q_5$ and the silicon nitride film 56 formed in the formation regions of the low voltage MIS transistors $Q_3$ and $Q_4$. More specifically, upon dry etching of the silicon oxide film 57 formed in the memory cell formation region and the formation region of the high voltage MIS transistor $Q_5$, the silicon nitride film 56 lying under the silicon oxide film 57 is protected by the silicon oxide film 57 almost until completion of the dry etching, while etching of the silicon nitride film 56 formed in the formation regions of the low voltage MIS transistors $Q_3$ and $Q_4$ proceeds because it is exposed therefrom, resulting in a difference of the thickness of the silicon nitride film. Such a difference in the thickness of the silicon nitride film 56 by region causes a difference in the finish time of etching in the subsequent etching step of the silicon nitride film 56. The finish time of etching cannot be determined. It leads to variations in the etching time of the silicon nitride film 56 among wafers, resulting in variations in the width of the sidewall spacers. For example, variations appear in the width of the sidewall spacers of the memory gate electrode 34 formed in each wafer.

In Embodiment 2, on the other hand, the whole surface of the semiconductor substrate 20 is etched first by anisotropic dry etching. Upon this etching, the silicon oxide film 57 is formed as a top layer not only in the memory cell formation region and the formation region of the high voltage MIS transistor $Q_5$, but also in the formation regions of the low voltage MIS transistors $Q_3$ and $Q_4$. In contrast to Embodiment 1, the silicon nitride film 56 is not exposed from the formation regions of the low voltage MIS transistors $Q_3$ and $Q_4$. More specifically, upon etching of the silicon oxide film 57, the thickness of the silicon oxide film 57 over the silicon nitride film 56 is not different between in the memory cell formation region and the formation region of the high voltage MIS transistor $Q_5$ and in the formation regions of the low voltage MIS transistors $Q_3$ and $Q_4$. By anisotropic dry etching of the silicon oxide film 57, no difference therefore appears in the thickness between the silicon nitride film 56 that is formed in the memory cell formation region and the formation region of the high voltage MIS transistor $Q_5$ and the silicon nitride film 56 that is formed in the formation region of the low voltage MIS transistors $Q_3$ and $Q_4$. After the dry etching, the silicon oxide film 57 remaining over the sidewalls of the gate electrode 43 and gate electrode 44 are removed by wet etching. In wet etching, an adequate selectivity to the silicon oxide film 57 over the silicon nitride film 56 can be secured easily compared with dry etching. The silicon nitride film 56 exposed in the formation regions of the low voltage MIS transistors $Q_3$ and $Q_4$ is not removed by wet etching. Thus, there appears no difference in the thickness of the silicon nitride film 56 by region, even after wet etching.

In Embodiment 2, the silicon nitride film 56 has a uniform thickness so that upon etching of the silicon nitride film 56, a difference hardly appears in the finish time of etching, and to the finish time can be determined definitely. It is therefore possible to suppress variations in the width of the sidewall spacers by wafer. Embodiment 2 does not include a step of removing the silicon oxide film 57 formed in the memory cell formation region and the formation region of the high voltage MIS transistor $Q_5$ by anisotropic dry etching, while exposing the silicon nitride film from the formation regions of the low voltage MIS transistors $Q_3$ and $Q_4$. A high etching selectivity as required in Embodiment 1 is not necessary in this embodiment.

Embodiment 3

In connection with Embodiments 1 and 2, a memory cell having the MONOS transistor $Q_1$ for memory and MIS transistor $Q_2$ for cell selection was described. In Embodiment 3, a memory cell having only the MONOS transistor $Q_1$ will be described.

Figure 33:
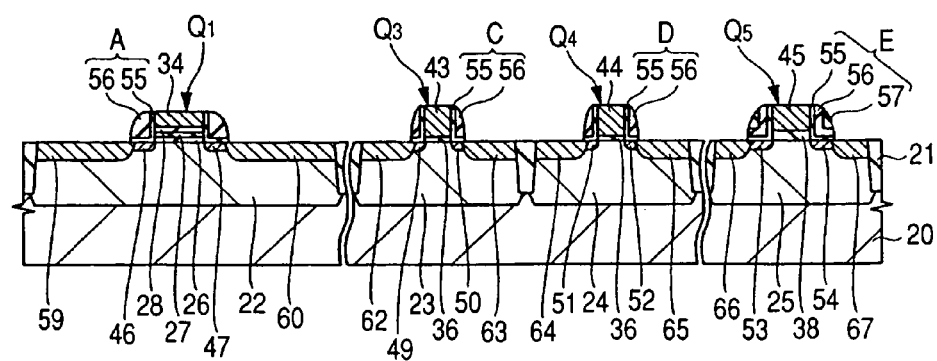
FIG. 33 is a cross-sectional view illustrating a step in the manufacture of a semiconductor device according to Embodiment 3 of the present invention.

FIG. 33 is a cross-sectional view illustrating a step in the manufacture of the MONOS transistor $Q_1$ and MIS transistors $Q_3$ to $Q_5$ according to Embodiment 3. In FIG. 33, sidewall spacers A, sidewall spacers C, sidewall spacers D, and sidewalls E are formed over the sidewalls of the memory gate electrode 34, the sidewalls of the gate electrode 43, the sidewalls of the gate electrode 44, and the sidewalls of the gate electrode 45, respectively.

The voltage during a writing operation in the MONOS transistor $Q_1$ according to Embodiment 3 is similar to that used in Embodiment 1. More specifically, a voltage of about −10.5V is applied to the memory gate electrode 34, the source region (high-concentration n-type-impurity diffusion region 59), the drain region (high-concentration n-type-impurity diffusion region 60) and the semiconductor substrate 20. Since a potential difference of the memory gate electrode 34 of the MONOS transistor $Q_1$ relative to the semiconductor substrate 20 is about +12V, electrons in the semiconductor substrate 20 tunnel through the gate insulating film 26 and are stored in the trap level of the charge storage film 27.

An erasing operation in this embodiment is similar to that employed in Embodiment 1. More specifically, a voltage of about 1.5V is applied to the source region (high-concentration n-type-impurity diffusion region 59), the drain region (high-concentration n-type-impurity diffusion region 60) and the semiconductor substrate 20, while a voltage of about −8.5V is applied to the memory gate electrode 34. A potential difference of the semiconductor substrate 20 relative to the memory gate electrode 34 is about +10V. Electrons stored in the charge storage film 27 of the MONOS transistor $Q_1$ tunnel through the gate insulating film 26 and transfer into the semiconductor substrate 20. Electrons charged in the charge storage film 27 are drawn into the semiconductor substrate 20, while the holes are accumulated in the charge storage film 27.

A reading operation will be described next. In this case, a voltage of about 0V is applied to the source region (high-concentration n-type-impurity diffusion region 59) and the memory gate electrode 34. To the semiconductor substrate 20, a voltage of about −2.0V is applied, while a voltage of about 1.0V is applied to the drain region (high-concentration n-type-impurity diffusion region 60). When electrons are stored in the charge storage film 27 of the MONOS transistor $Q_1$, the threshold voltage of the MONOS transistor $Q_1$ exceeds 0V, so that no current passes between the source electrode and drain electrode when about 0V is applied to the memory gate electrode. When holes are accumulated in the charge storage film 27 of the MONOS transistor $Q_1$ (including the case where the charge is not stored), on the other hand, the threshold voltage of the MONOS transistor $Q_1$ becomes 0V or less so that a current passes between the source region and drain region when about 0V is applied to the memory gate electrode. Thus, 1 bit of information can be stored, depending on the passage of a current.

The sidewall spacers A and sidewall spacers C to E are formed in similar steps as described in connection with Embodiment 2. More specifically, the sidewall spacers A, C and D are each made of a silicon oxide film 55 and a silicon nitride film 56, while the sidewalls E are each made of a silicon oxide film 55, a silicon nitride film 56 and a silicon oxide film 57. As described in connection with Embodiment 2, the thickness of the silicon nitride film 56 of the sidewall spacers A is larger than that of the silicon nitride film 56 -of the sidewall spacers C and D. The width of the sidewall spacers A is therefore greater than the width of the sidewall spacers C and D. The sidewalls E are each a three-layer film made of the silicon oxide film 55, silicon nitride film 56 and silicon oxide film 57 so that the sidewalls E have a width greater than that of the sidewall spacers A.

As in Embodiments 1 and 2, the silicon oxide film 55 of the sidewall spacers A is made thicker than the gate insulating film 26 of the MONOS transistor $Q_1$ and, therefore, similar advantages are available.

By using the steps of Embodiment 2, it is possible to differentiate the widths of the sidewall spacers among the MONOS transistor $Q_1$ and MIS transistors $Q_3$ to $Q_5$ even if the memory cell is made of only the MONOS transistor $Q_1$.

The present invention has described specifically based on various embodiments. However, it should be borne in mind that the present invention is not limited to or by them. It is needless to say that it can be modified within an extent not departing from the scope of the invention.

In Embodiment 1, two transistors which are different in the width of sidewall spacers were formed. The present invention is not limited to them, but at least three transistors which are different in the width of the sidewall spacers can be formed. It is possible to form n+1 transistors which are different in the width of sidewalls by forming n (n stands for an integer of 2 or greater) stopper layers for wet etching.

In Embodiments 1 to 3, the MONOS transistor was used as an example of a transistor for memory of a rewritable nonvolatile memory cell, but an MNOS transistor having a gate electrode formed directly on a charge storage film can be used instead.

As described in connection with Embodiments 1 to 3, use of a silicon nitride film as the charge storage film is desired, but a polysilicon film can be used instead as the charge storage film.

Advantages available by a representative embodiment, among the embodiments disclosed by in present application, will be described briefly.

It is possible to improve the electrical properties of each element in a semiconductor device having a MOS transistor requiring a high current driving capability for attaining high speed operation and a MOS transistor requiring a high breakdown voltage, and including a rewritable nonvolatile memory cell.

It is possible to manufacture a semiconductor device having a MOS transistor requiring a high current driving capability for attaining high speed operation and a MOS transistor requiring a high breakdown voltage, and including a rewritable nonvolatile memory cell, in simplified steps, while improving the electrical properties of each element.

The present invention can be used widely in the semiconductor device manufacturing industry.

What is claimed:

1. A manufacturing method of a semiconductor device for forming a rewritable nonvolatile memory cell including a first field effect transistor for memory, forming a circuit including a second field effect transistor and forming a circuit including a third field effect transistor, comprising the steps of:
    (a) forming a first gate insulating film of the first field effect transistor over a semiconductor substrate;
    (b) forming a second gate insulating film of the second field effect transistor over the semiconductor substrate;
    (c) forming a third gate insulating film of the third field effect transistor over the semiconductor substrate;
    (d) forming a first gate electrode of the first field effect transistor over the first gate insulating film;
    (e) forming a second gate electrode of the second field effect transistor over the second gate insulating film;
    (f) forming a third gate electrode of the third field effect transistor over the third gate insulating film;
    (g) forming first sidewall spacers over the sidewalls of the first gate electrode;
    (h) forming second sidewall spacers over the sidewalls of the second gate electrode; and
    (i) forming third sidewall spacers over the sidewalls of the third gate electrode,
    wherein the third gate insulating film is formed to have a thickness larger than the thickness of the second gate insulating film,
    wherein the third gate electrode is formed to have a length smaller than the length of the first gate electrode and larger than the length of the second gate electrode, and
    wherein the first sidewall spacers and the third sidewall spacers are formed such that the width of each is larger than the width of the second sidewall spacers, respectively.

2. A manufacturing method of a semiconductor device according to claim 1,
    wherein the step (a) comprises:
    (a1) forming a first insulating film over the semiconductor substrate;
    (a2) forming a charge storage film over the first insulating film; and
    (a3) forming a second insulating film over the charge storage film, and
    wherein, in the step (d), first gate electrode is formed over the second insulating film.

3. A manufacturing method of a semiconductor device according to claim 1,
    wherein the step (g) and the step (i) are the same step.

4. A manufacturing method of a semiconductor device according to claim 3,
    wherein the step (h) is a different step from the step (g) and the step (i).

5. A manufacturing method of a semiconductor device according to claim 1,
    wherein the step (g) comprises:
    (g1) forming a first silicon oxide film over the semiconductor substrate such that the first silicon oxide film covers the first gate electrode;
    (g2) forming a first silicon nitride film over the first silicon oxide film; and
    (g3) forming a second silicon oxide film over the first silicon nitride film.

6. A manufacturing method of a semiconductor device according to claim 5,
    wherein, after the step (g), the first sidewall spacers are formed of the first silicon oxide film and the first silicon nitride film.

7. A manufacturing method of a semiconductor device according to claim 5,
    wherein the first silicon oxide film, the first silicon nitride film and the second silicon oxide film are formed by a method of chemical vapor deposition.

8. A manufacturing method of a semiconductor device according to claim 5,
    wherein the first silicon nitride film is formed to have a thickness larger than that of the first silicon oxide film.

9. A manufacturing method of a semiconductor device according to claim 8,
    wherein the second silicon oxide film is formed to have a thickness larger than that of the first silicon oxide film.

10. A manufacturing method of a semiconductor device according to claim 5,
wherein the first silicon nitride film is used as an etching stopper at the time of the second silicon oxide film being etched.

11. A manufacturing method of a semiconductor device according to claim 5,
wherein the step (a) comprises:
(a1) forming a first insulating film over the semiconductor substrate;
(a2) forming a charge storage film over the first insulating film; and
(a3) forming a second insulating film over the charge storage film,
wherein, in the step (d), the first gate electrode is formed over the second insulating film, and
wherein the thickness of the first silicon oxide film is larger than that of the first insulating film.

12. A manufacturing method of a semiconductor device according to claim 1,
wherein the operating voltage of the third field effect transistor is lower than that of the first field effect transistor and higher than that of the second field effect transistor.

13. A manufacturing method of a semiconductor device according to claim 1,
wherein, at completion of step (g), the first sidewall spacers are formed of a silicon oxide film and a silicon nitride film thereon, respectively.

* * * * *